(12) United States Patent
Cecil

(10) Patent No.: US 11,748,553 B2
(45) Date of Patent: Sep. 5, 2023

(54) MASK RULE CHECKING FOR CURVILINEAR MASKS FOR ELECTRONIC CIRCUITS

(71) Applicant: Synopsys, Inc., Mountain View, CA (US)

(72) Inventor: Thomas Christopher Cecil, Menlo Park, CA (US)

(73) Assignee: Synopsys, Inc., Sunnvale, CA (US)

( * ) Notice: Subject to any disclaimer, the term of this patent is extended or adjusted under 35 U.S.C. 154(b) by 0 days.

(21) Appl. No.: 18/088,195

(22) Filed: Dec. 23, 2022

(65) Prior Publication Data

US 2023/0129457 A1    Apr. 27, 2023

Related U.S. Application Data

(62) Division of application No. 17/572,201, filed on Jan. 10, 2022, now Pat. No. 11,568,127, which is a division of application No. 16/892,252, filed on Jun. 3, 2020, now Pat. No. 11,222,160.

(60) Provisional application No. 62/858,714, filed on Jun. 7, 2019.

(51) Int. Cl.
*G06F 30/398* (2020.01)
*G03F 1/36* (2012.01)

(52) U.S. Cl.
CPC .............. *G06F 30/398* (2020.01); *G03F 1/36* (2013.01)

(58) Field of Classification Search
CPC .................................................... G06F 30/398
USPC ............................................................ 716/52
See application file for complete search history.

(56) References Cited

U.S. PATENT DOCUMENTS

2011/0099529 A1*   4/2011   Heng .................... G06F 30/398
716/106

* cited by examiner

*Primary Examiner* — Eric D Lee
(74) *Attorney, Agent, or Firm* — Fenwick & West LLP

(57) ABSTRACT

A system performs mask rule checks (MRC) for curvilinear shapes. The width of a curvilinear shape is different along different parts of the shape. A medial axis for a curvilinear shape is determined. The medial axis is trimmed to exclude portions that are within a threshold distance from corners or too far from edges. The trimmed medial axis is used to perform width checks for mask rules. The system generates medial axis between geometric shapes and uses it to determine whether two geometric shapes are at least a threshold distance apart. The system performs acute angle checks for sharp corners. The system determines angles using lines drawn from vertices to end points on the boundary of the shape that are at a threshold distance. These angles are used for checking acute angle mask rule violations.

20 Claims, 19 Drawing Sheets

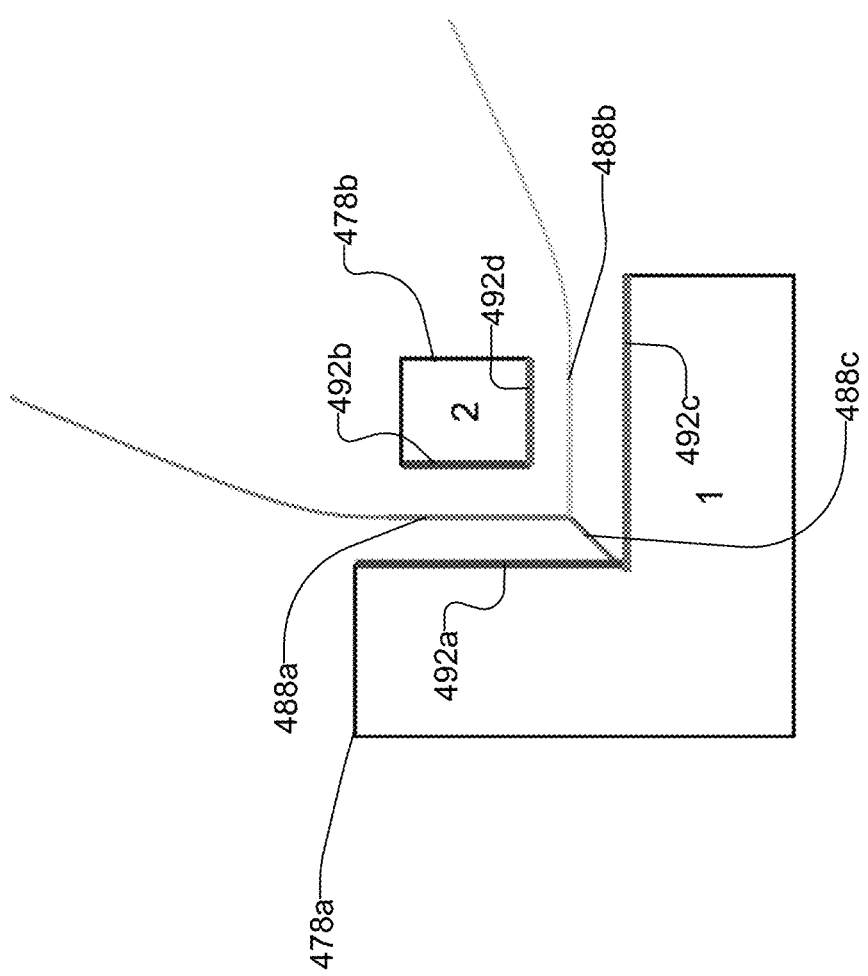

Local Angle, Θ, at a point, P, on the mask edge defined as the angle between two secant lines emanating from P which intersect the first points, Q1, Q2, found when moving along the edge away (CCW, CW respectively) from P which are a distance A from P.

A=dbu*0.1,
sharp_feature_thresh=90

MASK RULE CHECKING FOR CURVILINEAR MASKS FOR ELECTRONIC CIRCUITS

CROSS REFERENCE TO RELATED APPLICATIONS

This application is a divisional of U.S. patent application Ser. No. 17/572,201, filed on Jan. 10, 2022, which is a divisional of U.S. patent application Ser. No. 16/892,252, filed on Jun. 3, 2020, (now U.S. Pat. No. 11,222,160), which claims the benefit of U.S. Patent Application No. 62/858,714, filed on Jun. 7, 2019, the contents of all of the foregoing are incorporated by reference herein.

TECHNICAL FIELD

This disclosure relates to the field of electronic design automation in general, and more specifically to mask rule checking for electronic circuits.

BACKGROUND

The electronic design automation (EDA) process includes a physical verification stage during which the layout design is checked to ensure that manufacturing constraints are correct, such as design rule check (DRC) constraints, electrical constraints, and lithographic constraints. A tape-out stage creates data to be used for production of lithography masks. During mask data preparation, the tape-out data is used to produce lithography masks that are used to produce finished integrated circuits.

A mask rule check is performed to ensure that the lithography masks conform to certain mask rules. Advances in mask writing technology allow curvilinear masks that use geometric shapes that are more flexible than Manhattan shapes. Conventional mask rule checking techniques designed for Manhattan masks are unable to process masks that include curvilinear shapes.

SUMMARY

Disclosed is a configuration (e.g., system, method, non-transitory computer readable stored medium that includes stored instructions executable by a processor) for performing mask rule checking of masks for electronic circuits. The mask representation may include geometric shapes (for example, polygons) that are non-Manhattan, for example geometric shapes with curved edges that may be represented in piecewise linear form.

A mask rule checking system (also referred to as a system) receives a mask representation for an electronic circuit. The mask rules include a rule that requires geometric shapes to have at least a threshold width. The width of a curvilinear geometric shape may be different in different portions of the geometric shape. Also, the geometric shape includes corners in which the width may be below a threshold width specified by the mask rules, however these are not violations of the mask rules since these represent valid masks.

The following steps are performed for each geometric shape. A medial axis is determined for the geometric shape. The medial axis represents points within the geometric shape that have at least two closest points on the boundary of the geometric shape. Accordingly, each point on the medial axis is equidistant from at least two points on the boundary of the geometric shape that are closest to the point.

The system identifies portions of the medial axis that are close to at least one corner of the geometric shape. The system trims the medial axis by excluding portions that are close to any corner of the geometric shape. The system performs mask rule checks using the portion of the geometric shape that corresponds to the trimmed medial axis. The system may report any mask rule violations detected, for example, via a user interface.

In an embodiment, the portions of the medial axis that are close to a corner of the geometric shape are identified as follows. The system identifies a point P on the medial axis and a pair of points (P1, P2) that represent the closest points on the boundary of the geometric shape to point P. The system determines whether a perimeter distance between the pair of points (P1, P2) is below a perimeter threshold. If the perimeter distance between (P1, P2) is below the perimeter threshold, the system marks point P as being close to at least a corner of the geometric shape. Accordingly, point P is excluded when the medial axis is trimmed.

In an embodiment, the system further identifies portions of the medial axis that are far from edges of the geometric shape. The medial axis is further trimmed by excluding the portions of the medial axis determined to be far from edges of the geometric shape. The portions of the trimmed medial axis that remain represent portions of geometric shapes that violate the width mask rule. The mask rule checking system identifies the portions of the geometric shape that correspond to the trimmed medial axis and reports them as mask rule violations.

In an embodiment, the system identifies portions of the medial axis that are far from corners of the geometric shape as follows. The system identifies a point on the medial axis and determines whether the distance between the identified point and the closest point on an edge of the geometric shape is greater than a maximum clearance threshold. If the distance between the identified point and the closest point on an edge of the geometric shape is greater than a maximum clearance threshold, the system marks the identified point as a point far from edges of the geometric shape. Accordingly, the point is excluded when the medial axis is trimmed.

Some embodiments described in the disclosure perform mask rule checks to determine whether geometric shapes in the mask representation include sharp corners. The mask rules require the geometric shapes to have corners that are not too sharp. For example, the mask rules prevent geometric shapes from including acute angles that are smaller than a threshold. A curvilinear shape may have a piecewise linear representation that includes several small line segments. The angles between these adjacent line segments may be obtuse even if they form a sharp corner of the geometric shape. As a result, comparing these individual angles against a threshold does not allow the sharp corner to be detected.

The system performs mask rule checks for sharp corners as follows. The system selects a point (for example, point P) on the boundary of the geometric shape. The system identifies a pair of end points on the boundary of the geometric shape that are at a threshold distance from the point P. The threshold distance value may be preconfigured. The system determines an angle formed by lines connecting each end point to the point P. The system determines whether the determined angle is below an acute angle threshold specified by an acute angle mask rule. If the system identifies one or more such points having an angle smaller than the acute angle threshold, the system reports the identified points as mask rule violations.

In an embodiment, one of the end points used for determining the angle based on the vertex is obtained by traveling clock wise starting from the vertex point along the boundary of the geometric shape, and the other end point is obtained by traveling counter clock wise starting from the vertex point along the boundary of the geometric shape.

In an embodiment, the system modifies the geometric shape to fix a mask rule violation. For example, the system may increase the width in certain portions of a geometric shape that violates a width mask rule such that the modified geometric shape conforms to the width mask rule. Similarly, the system may increase the angle associated with a vertex point, such that the modified geometric shape conforms to the acute angle mask rule.

In some embodiments, the system, analyzes the mask to identify violations of a distance mask rule that requires geometric shapes to maintain a minimum distance between the geometric shapes. The system determines a medial axis for the geometric shapes in the mask representation. The medial axis includes several portions, each portion including points that are equidistant from a pair of geometric shapes. The system selects a portion that is associated with a pair of geometric shapes. The system samples a set of points on the selected portion and performs the following steps for each sampled point. The system determines the distance between the point and each geometric shape from the pair of geometric shapes. The system determines whether the distance between the point and each of the pair of geometric shapes is less than a threshold distance $T_D$. If the distance between the point and each of the pair of geometric shapes is less than the threshold distance $T_D$, the system marks the pair of geometric shape as a violating the distance mask rule. The system may report all the mask rule violations, for example, via a user interface.

In an embodiment, the threshold distance $T_D$ is determined based on a minimum distance threshold between geometric shapes specified by a distance mask rule.

In an embodiment, the threshold distance $T_D$ is determined to be substantially equal to half the minimum distance threshold between geometric shapes specified by the distance mask rule.

In an embodiment, the system increases the distance between the pair of geometric shapes so that the pair of geometric shapes is at least the minimum threshold distance specified by the distance mask rule.

In an embodiment, the system modifies the mask to remove any mask violations determined. The system may send the modified mask for fabrication, for example, fabrication of a chip based on the circuit design corresponding to the mask representation being processed.

Embodiments include a non-transitory computer readable storage storing instructions that when executed by a computer processor cause the computer processor to perform steps according to any of the methods specified above or elsewhere in this disclosure.

Embodiments include a computer system that includes a computer processor and a non-transitory computer readable storage storing instructions that when executed by the computer processor cause the computer processor to perform steps according to any of the methods specified above or elsewhere in this disclosure.

The features and advantages described in this summary and the following detailed description are not all-inclusive. Many additional features and advantages will be apparent to one of ordinary skill in the art in view of the drawings, specification, and claims hereof.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 4E illustrates an exterior medial axis corresponding to geometric shapes of a mask according to an embodiment.

Figure 1A:
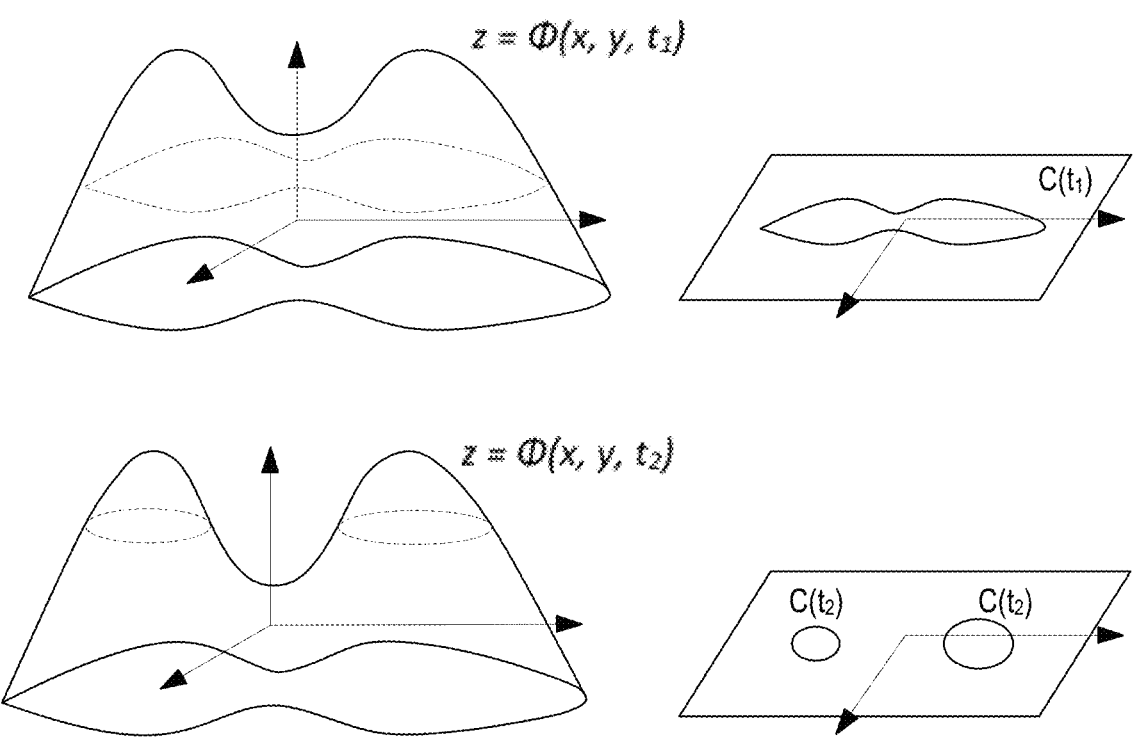
FIG. 1A illustrates creation of curvilinear masks from a pixelized representation of masks.

The figures depict various embodiments described in the present disclosure for purposes of illustration only. One skilled in the art will readily recognize from the following discussion that alternative embodiments of the structures and methods illustrated herein may be employed without departing from the principles of the invention described herein.

DETAILED DESCRIPTION

The EDA process includes steps for processing masks including mask rule checking (MRC) for ensuring that the masks conform to certain rules. The mask rule checks depend on the equipment used to fabricate an integrated circuit and the corresponding mask inspection capabilities. Conventional circuit design techniques use Manhattan masks in which edges of geometric shapes are parallel to the X and Y axes and geometric shapes are rectangular. These rules typically check constraints such as minimum widths between polygon edges, minimum space allowed between polygons, and similar metrics between corners, minimum areas, etc. For mask writers which can handle 45-degree edges as well, there are additional rules which are specified between edges and corners, acute angle checks, and so on.

Advances in mask writing technology allow curvilinear masks that use geometric shapes that are more flexible than Manhattan shapes. For example, curvilinear shapes may allow complex polygons or curved edges. Conventional mask rule checking techniques designed for Manhattan masks are unable to process curvilinear masks. For example, Manhattan mask rules check for width which is well defined for Manhattan shapes. However, a width of a curvilinear shape is not well defined since the width varies in different portions of the curvilinear shape as well as varies with the angle along which the width is measured. As another example, mask rule checking techniques for Manhattan mask rules check for acute angles to find sharp points i.e., sharp corners. However, a curvilinear shape may be represented as a polygon with a large number of small edges. Such a shape can include a sharp corner without including an acute angle since the sharp point may be represented using a large number of small edges where each pair of adjacent edges forms an obtuse angle.

As a result, conventional mask rule checking techniques are unable to verify that curvilinear shapes satisfy mask rule checks. Manhattan mask rule checking techniques may return false positives or false negatives if applied to curvilinear shapes. For example, these techniques may return violations for valid curvilinear masks and fail to find actual violations. Accordingly, conventional mask rule checking techniques are inadequate for processing curvilinear masks.

Mask writing technology has advanced and machines such as multi-beam e-beam mask writers allow all angle or curvilinear masks. However, curvilinear masks have specific restrictions and rules for what geometrical configurations are to be allowed when given to the machines.

During the mask synthesis flow the system may have the mask in various intermediate stages which may or may not meet the MRC requirements specified by the user. Therefore, the system according to various embodiments, checks the mask and fixes any MRC violations that are found.

Advantages of the present disclosure include, but are not limited to, performing mask rule checks on masks using curvilinear shapes including mask rule checks such as width checks of curvilinear shapes, minimum distance check between curvilinear shapes, and checks for detecting sharp corners in curvilinear shapes.

For some mask synthesis solvers, the mask may be represented in a pixelized form. For example, the system may store a gray mask representing mask transmission or a level set function, or another representation. The system converts the pixelized form to a polygon format and writes the output mask to a GDS (graphic design system) or oasis (open artwork system interchange standard) file.

FIG. 1A illustrates the creation of curvilinear masks from a pixelized representation of mask. The system performs the extraction by contouring the pixelized representation by extracting piecewise linear polygons from the pixelized grid by cutting it at a specified height. This results in creation of curvilinear masks.

Conventional mask rule definitions fail for such curvilinear masks. This is so because curvilinear shapes may not have clearly defined corners. Also, curvilinear masks may not have parallel edges. As a result, the typical edge to edge projection distances between parallel edges are not relevant. Accordingly, mask rules that specify width based on edge to edge distances are difficult to apply to curvilinear masks. Furthermore, curvilinear masks may be represented using a piecewise linear form that has a large number of edges. The number of edges in curvilinear masks may overwhelm a Manhattan MRC process. As a result, conventional Manhattan MRC processes often return either too many mask rule violations or fail to find actual mask rule violations.

Figure 1B:
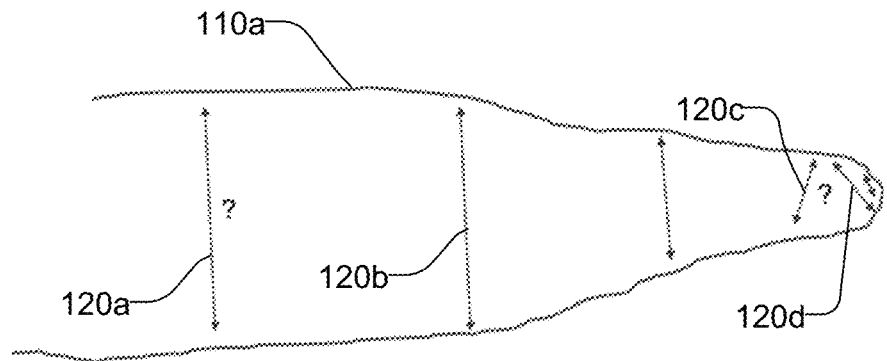
FIG. 1B shows an example curvilinear mask illustrating the difficulty in using typical edge to edge projections to define widths for a curvilinear geometric shape.

FIG. 1B shows an example curvilinear mask illustrating the difficulty in using typical edge to edge projections to define widths for a curvilinear geometric shape. The curvilinear geometric shape 110a does not follow Manhattan rules. Accordingly, the edge of the shape 110a may turn at various angles or form a smooth curve. As a result, the width 120 of the curvilinear geometric shape can be different in different portions of the curvilinear geometric shape. For example, in one portion, the width is 120a, in another portion, the width is 120b, and in another portion, the width is 120c. Furthermore, in certain portions where the curvature is higher, the width of the shape may depend on the angle at which the width is determined. For example, the widths 120c and 120d are different even though taken close to each other. A system that verifies width constraints for masks has to determine where to measure the width and which orientation should be used for the measurement gauge. For a curvilinear geometric shape these measurements are not well defined. This makes it difficult for conventional mask rule checks to handle curvilinear shapes.

Another example illustrates how conventional Manhattan checks fail for curvilinear shapes when identifying sharp corners. A corner represents a portion of a geometric shape where the physical distance between two points is significantly less than the perimeter distance between the points, i.e., a ratio of the physical distance between two points and the perimeter distance between the points is below a threshold value for corners.

FIG. 1B shows an example curvilinear mask illustrating the difficulty in using angles to define sharp corners for a curvilinear geometric shape. Manhattan mask rule checks identify sharp corners by identifying acute angles in the shapes. Typical polygon based acute angle checks use the neighboring edges at a polygon vertex to define the angle. However, for curvilinear masks, sharp corners may be represented using a piecewise linear form that has a large number of small edges. None of these adjacent edges form an acute angle. Therefore, such acute angle checks are unable to determine portions of curvilinear masks that have effective sharp corners, for example, a rounded elliptical sharp corner.

Figure 1C:
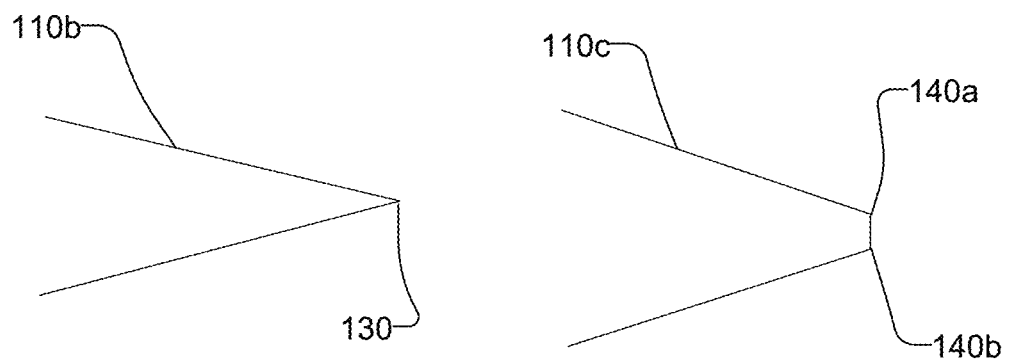
FIG. 1C shows an example curvilinear mask illustrating the difficulty in using angles to define sharp corners for a curvilinear geometric shape.

FIG. 1C illustrates a sharp corner represented as an acute angle 130 in the shape 110b is represented in a curvilinear shape 110c using multiple angles 140a and 140b. Even though angle 130 of shape 110b is an acute angle, each of the angles 140a and 140b is obtuse in spite of both shapes 110b and 110c having a sharp corner. Therefore, instead of using such neighbor to neighbor angle check, embodiments use an extended definition of angles based on neighboring edge chains extending from a vertex, X, in both directions to define the angle at X.

Furthermore, embodiments use skeletons to define the MRC widths and spaces, i.e., dimensional checks. More specifically, the system performs the following steps according to an embodiment. The system generates a medial axis (or a skeleton) for geometric shapes from which distances can be measured to detect dimensional violations. The system trims the skeleton to exclude certain portions. The system performs width checks using the skeleton.

FIGS. 1A, 1B, 1C, and the other figures use like reference numerals to identify like elements. A letter after a reference numeral, such as "110a," indicates that the text refers specifically to the element having that particular reference numeral. A reference numeral in the text without a following letter, such as "110," refers to any or all of the elements in the figures bearing that reference numeral (e.g. "110" in the text refers to reference numerals "110a" and/or "110b" in the figures).

Architecture of Mask Rule Checking System

Figure 2:
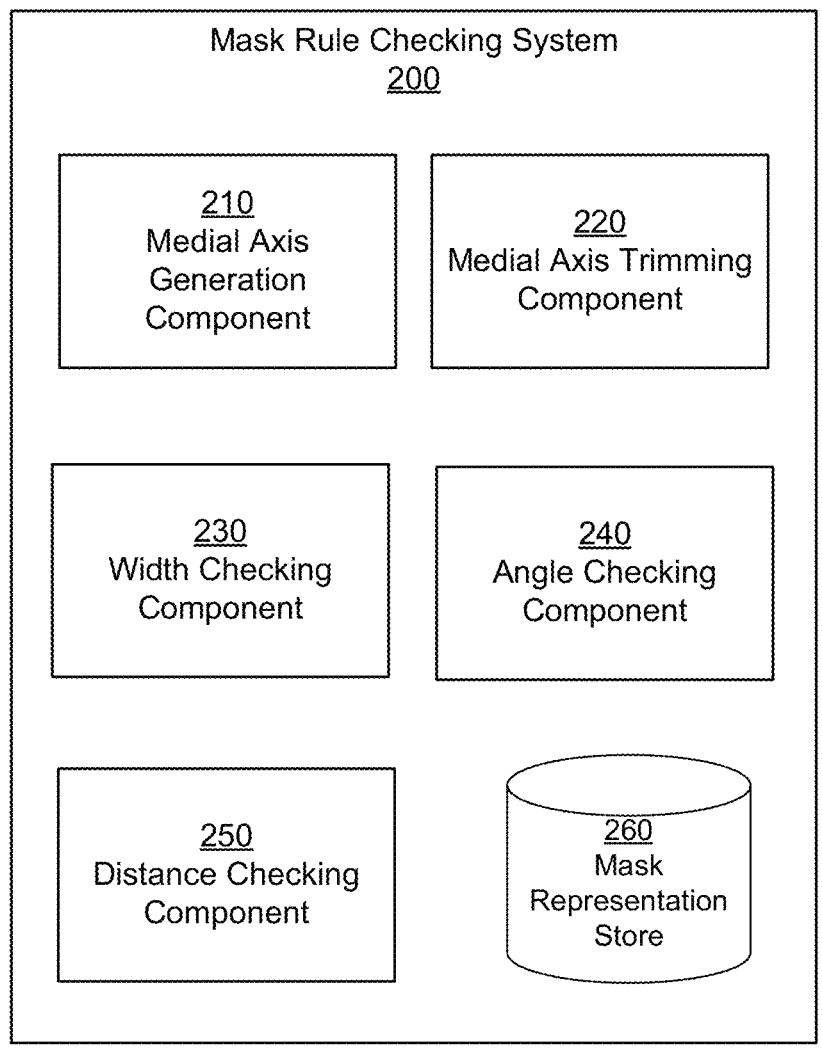
FIG. 2 shows a block diagram of a system architecture of a layout classification system according to an embodiment.

FIG. 2 shows a block diagram of a system architecture of a mask rule checking system according to an embodiment. The mask rule checking system 200 implements processes for performing certain specific types of mask rule checks for curvilinear shapes. Other mask rules such as area checks may be generalized from Manhattan mask rules. The mask rule checking system 200 includes a medial axis generation component 210, a medial axis trimming component 220, a width checking component 230, an angle checking component 240, distance checking component 250, and a mask representation store 260. Other embodiments may include more or fewer components than those indicated herein. Functionality indicated herein as being performed by a particular component may be performed by other components than those indicated herein.

The medial axis generation component 210 generates the medial axes for the geometric shapes of the mask. In an embodiment, the medial axis generation component 210 determines a Voronoi diagram of the input geometric shapes representing the mask. The medial-axis transform of each geometric shape is the portion of the line-segment Voronoi diagram that lies within the geometric shape. The medial axis of a geometric shape is also referred to herein as the skeleton of the geometric shape. The medial axis generation component 210 determines and stores the corresponding edges of the geometric shapes that were responsible for creating portions of the medial axis. The medial axis generation component 210 may also determine and store the distance between points on the medial axis and corresponding points on the edges of the geometric shapes that are closest to the points on the medial axis.

A medial axis that lies within geometric shapes is referred to as an interior medial axis. The interior medial axis represents points within a geometric shape that have at least two closest points on the boundary of the geometric shape. Similarly, a medial axis that is outside geometric shapes can be determined. The medial axis that is outside geometric shapes is referred to as an exterior medial axis. The exterior geometric axis represents points outside the geometric shapes that have two or more closest points on the boundary of the geometric shapes. The two or more closest points may be on the same geometric shape or on different geometric shapes. However, an exterior medial axis may be considered the same as an interior medial axis if the entire mask is assumed to be transformed such that it is within a geometric shape and each original geometric shape is treated as a hole within the geometric shape. Accordingly, the exterior medial axis of the original mask becomes an interior medial axis of the transformed mask. FIGS. 4D and 4E further elaborate the relation between exterior medial axis and interior medial axis.

Figure 4A:
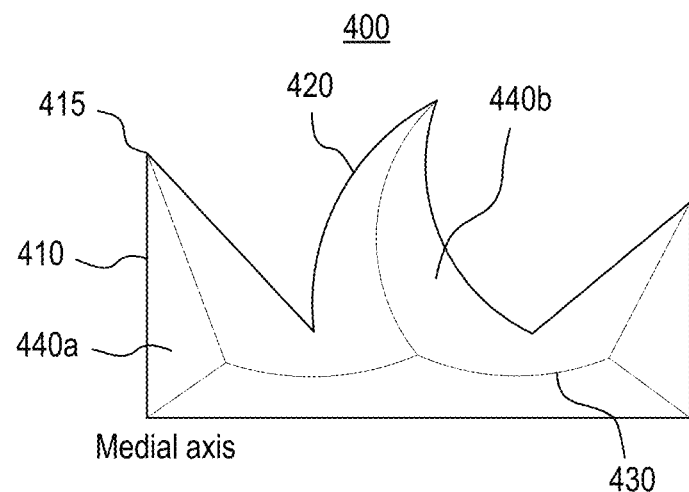
FIG. 4A shows an example medial axis in the center of an all angle polygon that extends into convex corners.
Figure 4B:
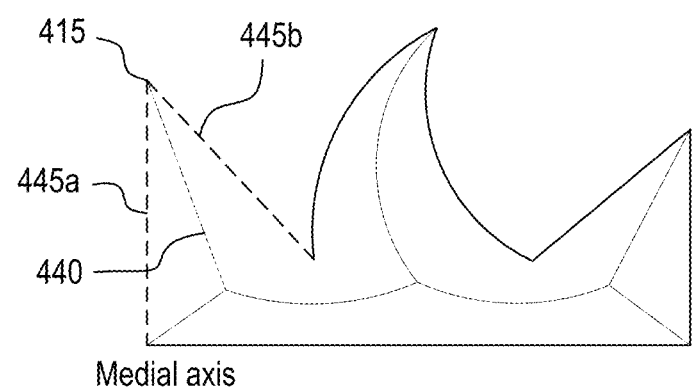
FIG. 4B illustrates generation of an individual section of the medial axis associated with two edges of the original polygon according to an embodiment.
Figure 4C:
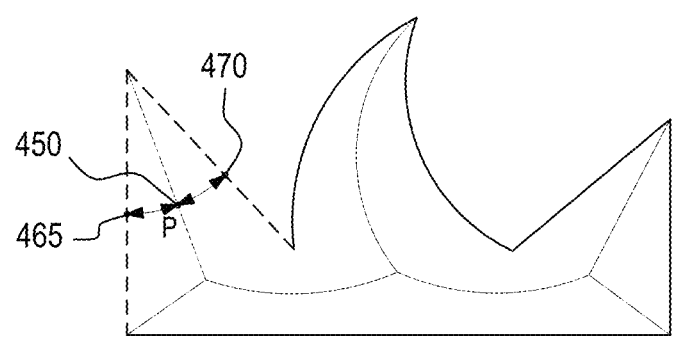
FIG. 4C illustrates that a point on the medial axis is associated with at least two points on geometric shape
Figure 4D:
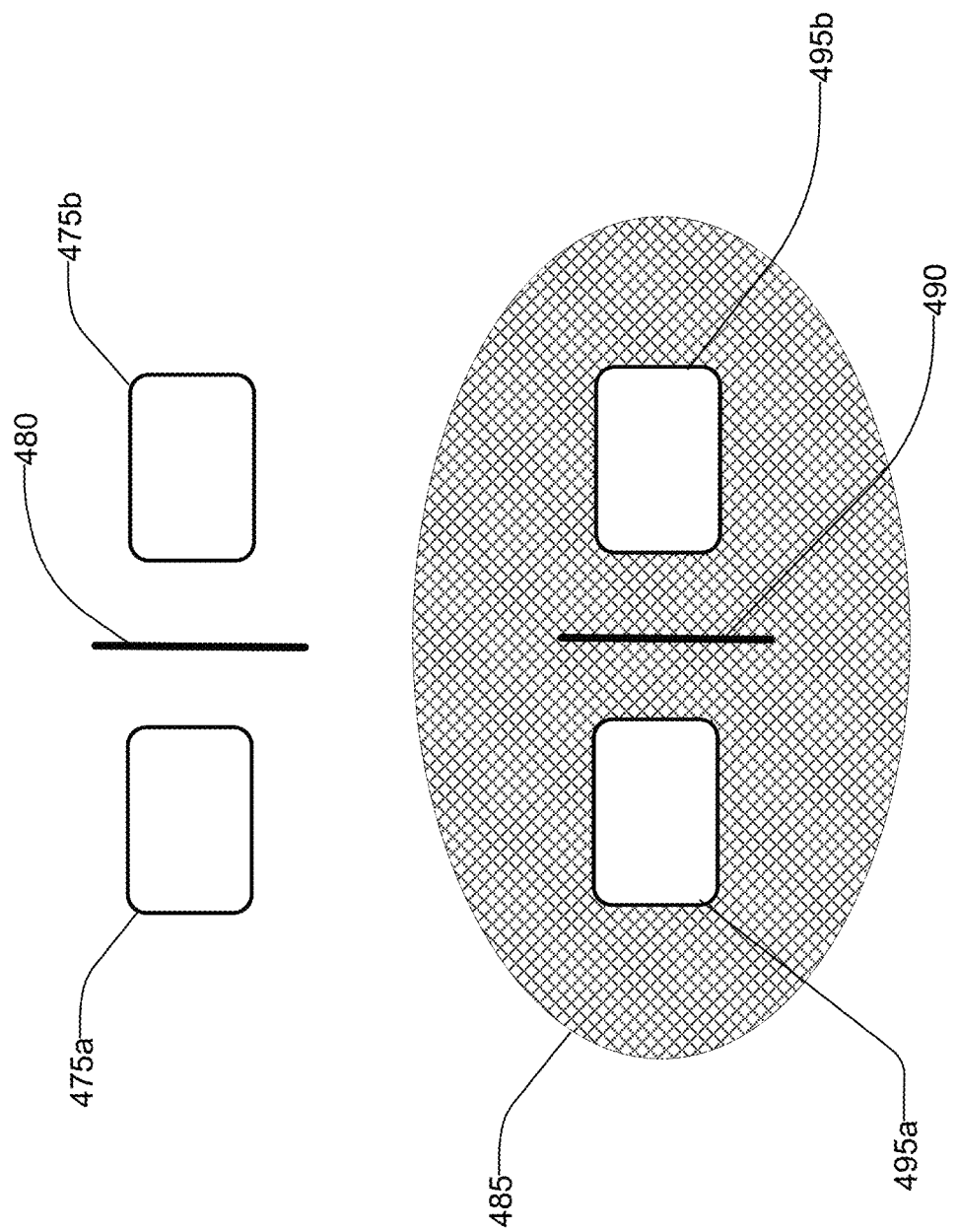
FIG. 4D illustrates that an exterior medial axis of a mask can treated similar to an interior medial axis according to an embodiment.

FIG. 4A-C illustrates a generation of medial axis for an example geometric shape as performed by the medial axis generation component 210. The medial axis generation component 210 generates the medial axis for each polygon by starting at each vertex of the polygon and growing the skeleton inward with an edge bisecting the angle between two neighboring edges. The bisecting edges meet at an internal vertex. This vertex represents a point equally far from the line segments adjacent to the vertices. One of the bisecting edges that is enclosed within a cell is eliminated while a bisector of the two segments is created from the internal vertex. This process is repeated until all edges terminate in vertices.

In other embodiments, the medial axis generation component 210 determines a medial axis by performing morphological thinning that successively removes pixels from the boundary while preserving the end points of line segments. The medial axis generation component 210 repeats this process until no more thinning is possible. The points remaining form a skeleton of the input shapes.

As another example, the medial axis generation component 210 determines a distance transform of an input specified as an image. The distance transform generates an image that is similar to the input image, except that the intensities of points inside regions are according to their distance to the closest boundary from each point. The medial axis generation component 210 identifies singularities, i.e., curvature discontinuities in the transformed image. The medial axis of the geometric shapes lies along the singularities in the transformed image.

The medial axis trimming component 220 performs various processes to trim portions of the medial axis. Trimming of the medial axis to remove portions that are close to corners is shown in FIG. 6. Trimming of the medial axis to remove portions that are far from the boundaries of the geometric shape ate are illustrated in FIG. 7.

The width checking component 230 performs width check of the geometric shapes of the masks. The mask rules specify a width threshold value such that the geometric shapes are required to have a width value that is greater than the specified width threshold. In some embodiments, the width checking component 230 performs the process illustrated in the flowchart of FIG. 3 to perform width check of the geometric shapes of the mask.

The angle checking component 240 determines whether any corners of geometric shapes violate the angle mask rule that requires all angles of the geometric shapes to be larger than an acute angle threshold. In an embodiment, angle checking component 240 performs the angle check by performing the process illustrated in FIG. 10.

The distance checking component 250 determines whether geometric shapes in the mask representation maintain a minimum distance threshold. In an embodiment, distance checking component 250 performs the distance check by performing the process illustrated in FIG. 15.

The mask representation store 260 stores the representations of the masks for electronic circuits. The mask representation of an electronic circuit includes geometric shapes. In an embodiment, the geometric shapes are polygons. The mask rule checking system 200 performs mask rule checks on geometric shapes including curvilinear shapes.

In an embodiment, the mask rule checking system 200 presents results of mask rule check via a user interface to a user. The mask rule checking system 200 configures the user interface and send for presentation to a user via a client device. The client device used by a user for interacting with the mask rule checking system 200 can be a personal computer (PC), a desktop computer, a laptop computer, a notebook, a tablet PC executing an operating system, for example, a Microsoft Windows®-compatible operating system (OS), Apple OS X®, and/or a Linux distribution.

The interactions between the client devices and the mask rule checking system 200 are typically performed via a network, for example, via the Internet. The network enables communications between the client device and the mask rule checking system 200. In one embodiment, the network uses standard communications technologies and/or protocols. The data exchanged over the network can be represented using technologies and/or formats including the hypertext markup language (HTML), the extensible markup language (XML), etc.

Mask Rule Checking Process

Figure 3:
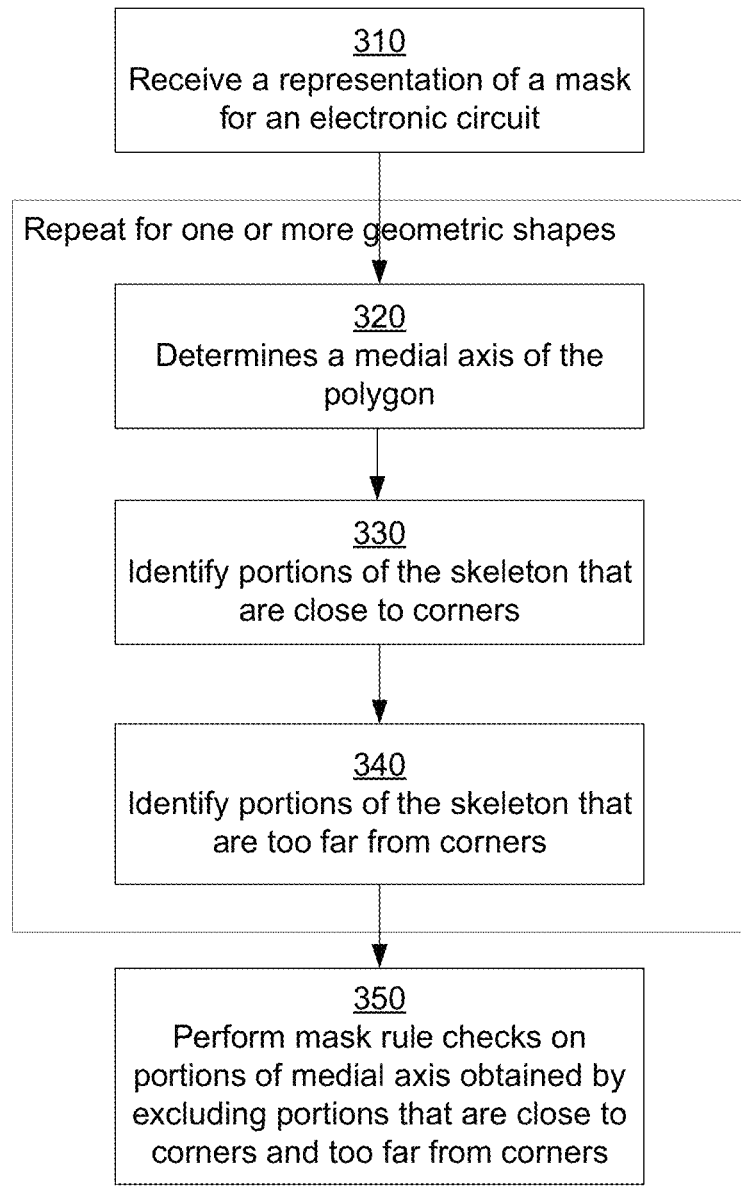
FIG. 3 depicts a flowchart of various processes used during the design and manufacture of an integrated circuit in accordance with some embodiments of the present disclosure.

FIG. 3 shows a flowchart illustrating the overall process of mask rule checking for curvilinear masks, according to an embodiment. The steps shown in the flowchart of FIG. 3 may be performed in an order different from that indicated in the flowchart. For example, certain steps may be performed in parallel with other steps. Furthermore, various steps shown in the flowchart may be performed using a parallel or distributed system.

The mask rule checking system 200 receives 310 as input, a representation of the mask for an electronic circuit. The mask representation may include curvilinear shapes. The mask rule checking system 200 performs the following steps 320, 330, 340 for each geometric shape of the mask representation. The mask rule checking system 200 determines 320 a medial axis of the geometric shape. The medial axis represents points within the geometric shape that have at least two closest points in the boundary of the geometric shape. The details of processes for determining medial axis of a geometric shape are described in connection with FIGS. 4A-C.

The mask rule checking system 200 identifies 330 portions of the medial axis that are too close (i.e., are proximate) to corners in the geometric shape. For example, portions of the medial axis that are within a threshold distance of a corner of the geometric shape may be identified. A portion of the medial axis that is within the threshold distance can be considered to be close to the corner in the geometric shape. Details of step 330 are described in connection with FIG. 6. In an embodiment, the mask rule checking system further identifies 340 portions of the medial axis that are too far from corners of the geometric shape. For example, portions of the medial axis that are not within a threshold distance of a corner of the geometric shape may be identified. A portion of the medial axis that is not within a threshold distance of a corner of the geometric shape can be considered to be too far from the corner in the geometric shape. Details of step 340 are described in connection with FIG. 7.

The mask rule checking system 200 trims the medial axis by excluding portions of the medial axis that are determined to be close to corners and portions of the medial axis that are determined to be too far from the corners. The mask rule checking system 200 performs 350 mask rule checks on the trimmed medial axis. Details of step 350 are described in connection with FIG. 8.

The mask rule checking system 200 excludes portions of the medial axis that are too close to the corners since these portions are expected to have smaller width by virtue being near corners. These do not represent violations of mask rules. The systems processing these masks include allowance for these portions.

In an embodiment, the mask rule checking system 200 trims the medial axis by excluding any one of the two types of portions of the medias axis, for example, either the portions that are close to corners or the portions that are far from edges and performs mask rule checks on the trimmed medial axis.

In an embodiment, mask rule checking system 200 selects candidate points from the trimmed medial axis. The mask rule checking system 200 checks whether each candidate point selected from the trimmed medial axis violates a minimum distance from edges of the geometric shape. If the mask rule checking system 200 detects mask rule violations, the mask rule checking system 200 may report the violations, for example, as a report that may be displayed via a user interface of the mask rule checking system 200.

Performing Mask Rule Checks

The system generates a skeleton representation of a mask by applying a medial axis transform. The system trims certain parts of the skeleton since they are not necessary for performing specific mask rule checks.

FIG. 4A shows an example medial axis in the center of an all angle polygon that extends into convex corners. The shape 400 has sharp corners 415 and curved edges 420. A curved edge may be represented using multiple segments that linearize the curved edge. Accordingly, a geometric shape that is curved may be represented as a polygon with a large number of edges. The medial axis 430 forms a skeleton representation of the geometric shape 400.

The medial axis divides the curvilinear shape into various regions that represent points within the curvilinear shape that are close to specific edges. For example, region 440*a* is close to the edge 410, region 440*b* is close to the edge 420, and so on.

The mask rule checking system 200 determines the medial axis for the geometric shapes that form the input mask of an electronic circuit. FIG. 4B illustrates generation of an individual section of the medial axis associated with two edges of the original polygon according to an embodiment.

FIG. 4C illustrates that a point on the medial axis is associated with at least two points on geometric shape. Each point on the medial axis of a geometric shape is equidistant from at least two points of the geometric shape. For example, point 450 is on the medial axis and is equidistance from the points 465 and 470 that lie on the geometric shape. As illustrated in FIG. 4C, point 450 is induced by points 465 and 470. The process for determining a medial axis also stores the portions of edges of the geometric shapes that are associated with corresponding portions of the medial axis. These represent points of the edges of the geometric shapes that are closest to the points on the medial axis.

FIG. 4D illustrates that an exterior medial axis of a mask can treated similar to an interior medial axis according to an embodiment. Assume that an input mask comprises geometric shapes 475a and 475b. An exterior medial axis of the input mask can be shown as the line 480. The mask can be transformed by enclosing the geometric shapes within a large geometric shape 485. The original shapes 475a and 475b of the input mask are transformed such that each geometric shape in the input mask corresponds to a hole within the geometric shape 485. Accordingly, the original shape 475a of the input mask becomes a hole 495a of the transformed mask and the original shape 475b of the input mask become a hole 495b of the transformed mask. Accordingly, the interior medial axis 490 of the transformed mask is equivalent to the exterior medial axis of the input mask. In this embodiment, the system ignores portions of the medial axis that are induced by the shape 485 since this shape is not part of the input mask.

Accordingly, any mask rule checking process based on an interior medial axis can be adapted to an equivalent mask rule check using an exterior medial axis and vice versa. For example, a mask rule check based on an exterior medial axis that checks if the geometric shapes are at least a minimum distance threshold in the input mask can be performed by transforming the mask as described above and performing a width check using the interior medial axis 490 to determine that the interior medial axis 490 is at least a minimum width threshold from the geometric shape boundaries. Alternatively, a width check using the interior medial axis 490 to determine that the interior medial axis 490 is at least a minimum width threshold from the geometric shape boundaries can instead be performed by performing a minimum distance check on the exterior medial axis that checks if the geometric shapes are at least a minimum distance threshold away from the exterior medial axis 480 in the input mask.

FIG. 4E illustrates an exterior medial axis corresponding to geometric shapes of a mask according to an embodiment. The exterior medial axis may have points that are induced by two or more geometric shapes. A point of a medial axis is induced by some geometric shapes if it is equidistant from points on the geometric shapes. The mask includes two geometric shapes 478a and 478b. The portion 488a of the medial axis is induced by the edge 492a of geometric shape 478a and edge 492b of geometric shape 478b. The portion 488b of the medial axis is induced by the edge 492c of geometric shape 478a and edge 492d of geometric shape 478b. However, portion 488c is induced by the edges 492a and 492c both of which belong to the same geometric shape 478a. Accordingly, a point on a medial axis may be induced by one or more geometric shapes.

Trimming Medial Axis Using Perimeter Threshold

Figure 5:
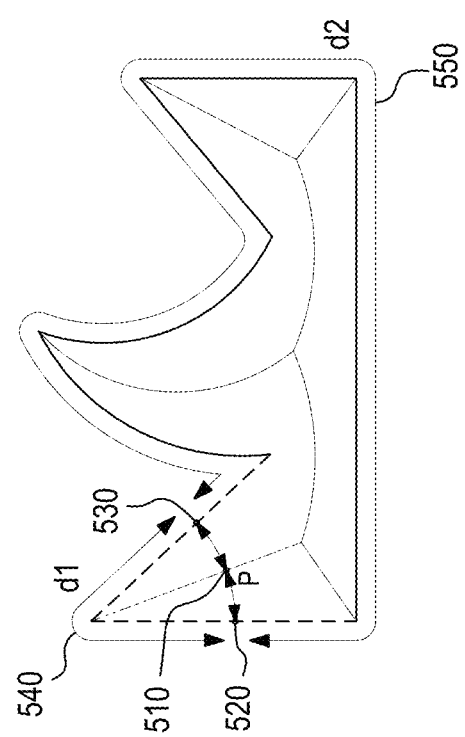
FIG. 5 illustrates how a point on a medial axis of a geometric shape is trimmed according to an embodiment.

FIG. 5 illustrates a method for determining whether a point on a medial axis of a geometric shape is trimmed according to an embodiment. For example, a point on a medial axis of a geometric shape may be trimmed if it is too close to a corner of the geometric shape according to an embodiment. The mask rule checking system 200 determines if a point P is trimmed from the medial axis or allowed to stay as part of the medial axis after trimming.

The mask rule checking system 200 determines a perimeter threshold. For a point 510 on the medial axis of a geometric shape, the mask rule checking system 200 determines the points 520 and 530 on the geometric shape that are closest to the point 510. The mask rule checking system 200 measures the perimeter distance of the geometric shape between the points 520 and 530 in both directions. The perimeter distance between two points on the boundary of a geometric shape is the distance that needs to be travelled from one point to reach the other point along the boundary of the geometric shape. For example, along one direction, the perimeter 540 of the geometric shape has a perimeter distance d1 and along another direction, the perimeter 550 of the geometric shape has perimeter distance d2.

The mask rule checking system 200 determines the minimum of the two perimeter distances d1 and d2. If the minimum of the two perimeter distances is less than a perimeter threshold, the mask rule checking system 200 determines that the point 510 is too close to a corner of the geometric shape and is marked for trimming. Alternatively, if the minimum of the two perimeter distances is greater than the perimeter threshold, the mask rule checking system 200 determines that the point 510 is not too close to a corner of the geometric shape and is marked for keeping in the medial axis for further performing mask rule checks.

Other embodiments may use other techniques determine whether a point is too close to a corner of the geometric shape using other techniques. In some embodiments, the mask rule checking system determines the perimeter based on dimensions of the width and space checks of the mask rules. The mask rule checking system 200 sets the distance between two points as infinity if the two points are on different polygons.

Figure 6A:
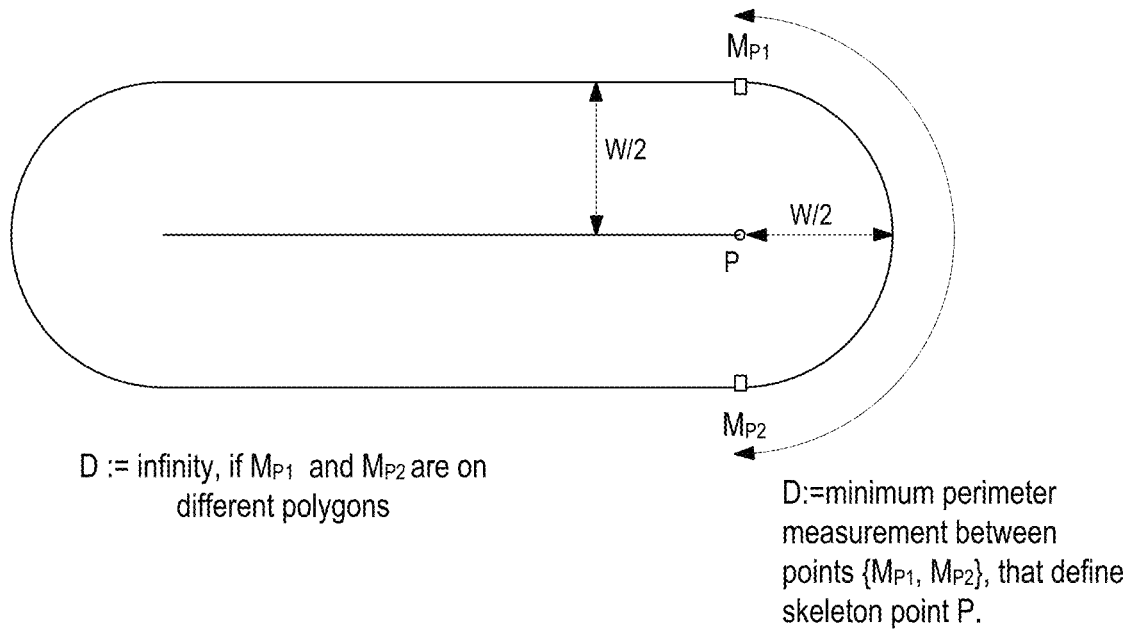
FIG. 6A illustrates the determination of a perimeter threshold value according to an embodiment.
Figure 7:
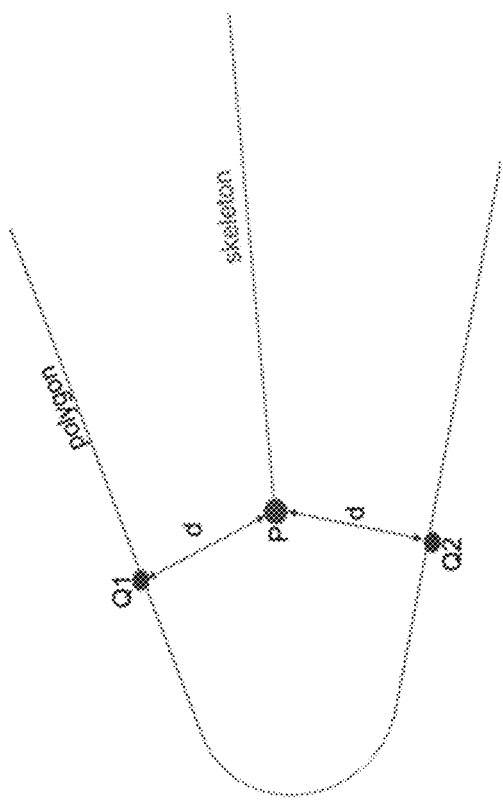
FIG. 7 illustrates filtering out points on the medial axis which are too far from the edges of the geometric shape to be considered minimum width or space violations according to an embodiment.

FIG. 6A illustrates determination of a perimeter threshold value according to an embodiment. The mask rule checking system determines the perimeter threshold as a value proportionate to a minimum width for geometric shapes as specified by mask rules. For example, for polygons with round corners, the mark rule checking system may determine the perimeter threshold to be $\pi W/2$, where W is the minimum width for geometric shapes as specified by mask rules. Accordingly, a point P on the medial axis is trimmed if a pair of points (P1, P2) on the geometric shape that are closest to the point P are less than $\pi W/2$, perimeter distance from each other.

The mask rule checking system 200 may set different perimeter threshold values for different types of geometric shapes. Accordingly, the perimeter threshold depends on the type of geometric shape. More specifically, the mask rule checking system 200 may determine the perimeter threshold based on a permitted shape of a corner of a geometric shape of the mask. For example, the perimeter threshold for geometric shapes with circular corners is different from perimeter threshold for geometric shapes with elliptical shaped corners or triangular corners. Note that even though the geometric shapes are considered circular or elliptical, these geometric shapes are linearized using multiple small adjacent edges.

Figure 6B:
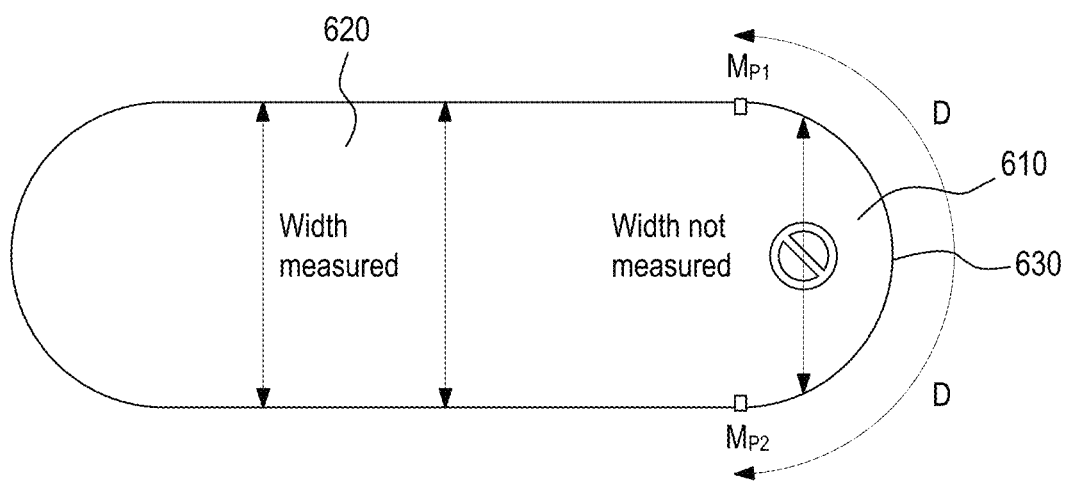
FIG. 6B illustrates the portions of a geometric shape for which the width is measured or not measured for performing mask rule checks according to an embodiment.

FIG. 6B illustrates the portions of a geometric shape for which the width is measured or not measured for performing mask rule checks according to an embodiment. Specifically, the width is not measured for mask rule checks in a region 610 that is determined to be close to a corner 630 and the width is measured for mask rule checks in a region 620 that is determined to be not close to any corner.

In some embodiment, the mask rule checking system 200 uses the perimeter threshold in conjunction with the angle check to specify where the mask rule checks will be performed if corners with different ellipticity are allowed.

FIG. 7 illustrates filtering out points on the medial axis which are too far from the edges of the geometric shape to be considered minimum width or space violations according to an embodiment. FIG. 7 shows a point P on the medial axis that is at a distance d from the edge of the geometric shape. The mask rule checking system 200 defines a parameter, maximum clearance threshold as the largest distance that any point on the medial axis can have from the edge of the geometric shape of the mask to be included in the medial axis. For example, the mask rule checking system 200 may set the maximum clearance threshold to be W/2, where W is the minimum width for geometric shapes as specified by mask rules.

The mask rule checking system 200 identifies a point on the medial axis and determines whether the distance between the identified point and the closest point on an edge of the geometric shape is greater than the maximum clearance threshold. If the distance between the identified point and the closest point on the edge of the geometric shape is greater than the maximum clearance threshold, the mask rule checking system 200 marks the identified point as being far from edges of the geometric shape. The mask rule checking system 200 excludes the identified points of the geometric shape. The mask rule checking system 200 excludes portions of the medial axis that are defined by parts of the mask which are more than a distance W away from each other.

In an embodiment, the mask rule checking system 200 samples points of the medial axis and performs the checks to determine whether they can be excluded. The mask rule checking system 100 samples points that are close to each other, for example, less than a threshold distance. Accordingly, if two points of the medial axis that are close to each other are marked for being excluded from the medial axis, the mask rule checking system 100 excludes the entire portion of the medial axis between the two points.

The mask rule checking system trims the medial axis by excluding portions of the medial axis identified as being too close to corners or too far from the edges of the geometric shapes of the mas. The mask rule checking system 100 performing mask rule checks on the trimmed medial axis. The remaining portions of the trimmed medial axis meet the requirements of FIG. 5 and FIG. 7 at the same time.

Figure 8:
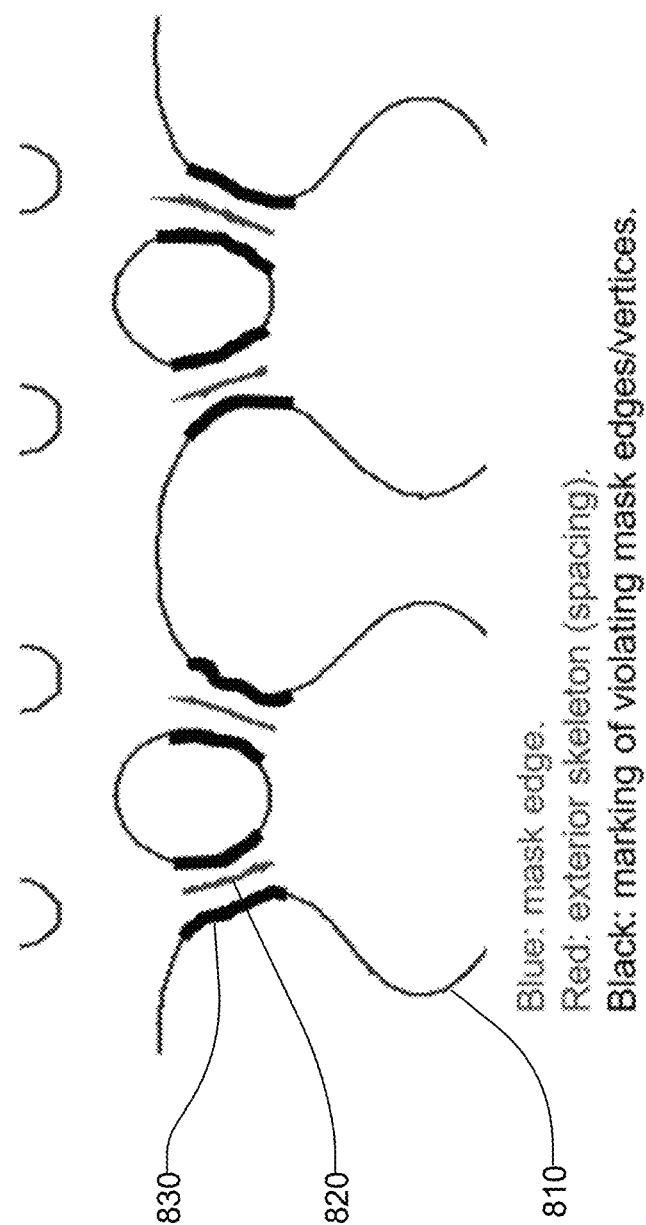
FIG. 8 shows the portions of the mask that represent violations of mask rules according to an embodiment.

FIG. 8 shows the portions of the mask that represent violations of mask rules according to an embodiment. The lines 820 represent the trimmed medial axis. The lines 810 represent edges of the geometric shapes of the mask. The mask rule checking system 200 identifying the portions of the geometric shapes representing closest points to the points of the trimmed medial axis. These are shown as edges 830 in FIG. 8. The mask rule checking system 200 marks the identified portions of the geometric shapes, i.e., edges 830 as violations of mask rules.

The mask rule checking system 200 may send information describing the identified portions of the geometric shapes marked as violations of mask rules for display, for example, via a user interface of the mask rule checking system 200. The mask rule checking system 200 may store the information describing the mask rule violations, for example, in a file and provide the file for review. The mask rule checking system may receive a modified mask from the user such that the modified mask does not violate any mask rules. The mask rule checking system may automatically modify the masks to remove the mask rule violations. The mask rule checking system may send the modified mask for fabrication of a chip based on the electronic circuit.

Sharp Angle Mask Rule Checks

Embodiments described in the present disclosure may perform sharp angle (or sharp corner) checks of curvilinear shapes that may not be detected using conventional Manhattan mask rule checks.

Figure 9A:
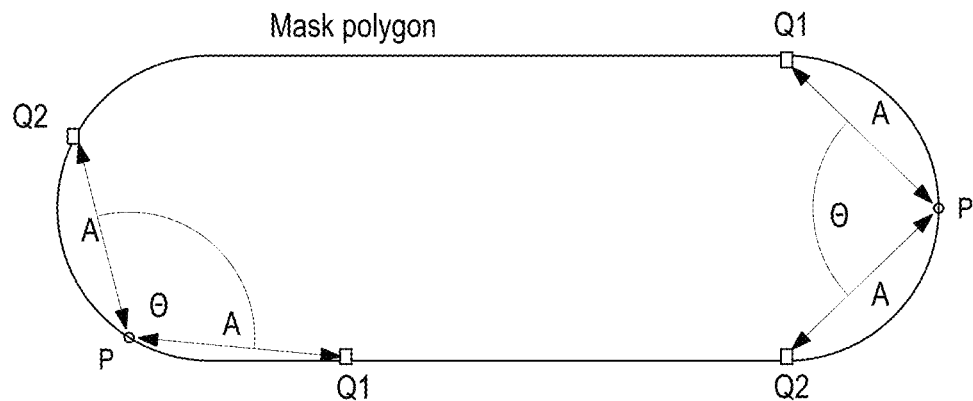
FIG. 9A shows a geometric shape with curvilinear edges for illustrating sharp angle (or sharp corner) checks according to an embodiment.
Figure 9B:
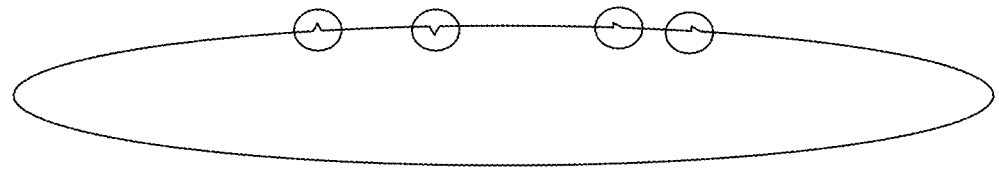
FIG. 9B shows another geometric shape with curvilinear edges with small notches for illustrating mask rule checks according to an embodiment.

FIG. 9A shows a geometric shape with curvilinear edges for illustrating sharp angle (or sharp corner) checks according to an embodiment. FIG. 9B shows another geometric shape with curvilinear edges with small notches for illustrating mask rule checks according to an embodiment.

As described herein, the curvilinear edges of geometric shapes of a mask may be represented using a piecewise linear representation that may include many small adjacent edges. As a result, the angles between any two adjacent segments are likely to be obtuse even though the geometric shape forms a sharp corner that is similar to an acute angle as shown in FIG. 1B. A mask rule check expects such geometric shapes to show a violation even though no particular vertex angle by itself is acute or represents a sharp corner. A Manhattan mask rule check simply compares angles between adjacent edges with threshold values to determine whether a geometric shape includes sharp angles. As a result, Manhattan mask rule checks fail to detect such sharp corners in geometric shapes of mask representations.

There may be very small bumps or sharp edges in the geometric shapes that have an acute angle, for example, as shown in FIG. 9B. The mask rule checks should ignore these rough portions of the edges even though they include sharp angles since the actual violations are at a larger scale than these minor bumps in edges. Conventional mask rule checks may flag these portions as mask rule violations since they compare each angle to a threshold value. However, embodiments are able to perform mask rule checks without flagging these minor bumps as mask rule violations.

Figure 10:
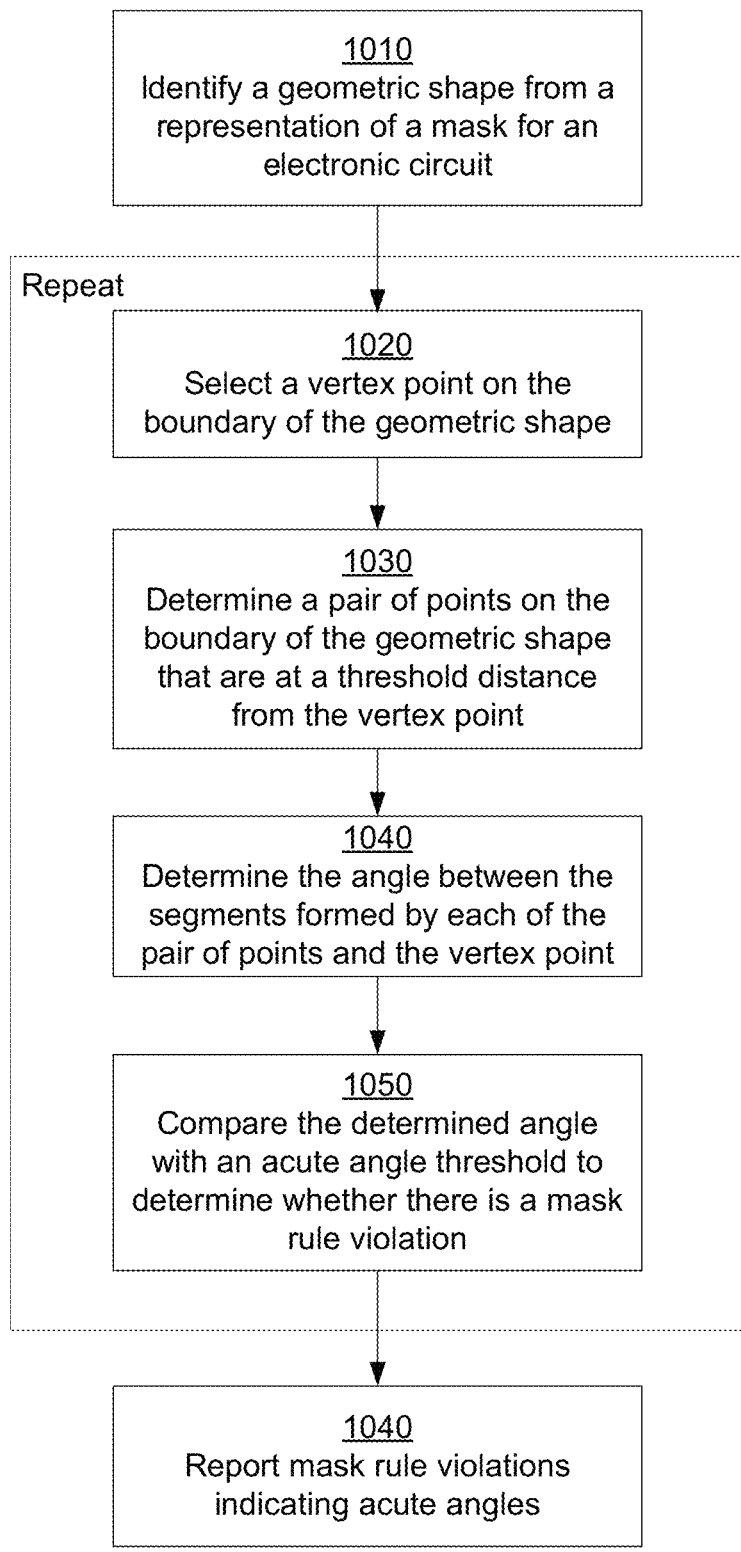
FIG. 10 shows a flowchart illustrating the process for performing acute angle checks for curvilinear shapes according to an embodiment.

FIG. 10 shows a flowchart illustrating the process for performing acute angle checks for curvilinear shapes according to an embodiment. The mask rule checking system 200 receives a mask representation for an electronic circuit for performing mask rule checks. The mask rule checking system 200 processes the geometric shapes of the mask representation.

The mask rule checking system 200 identifies 1010 a geometric shape from the mask representation for acute angle checks. The mask rule checking system 200 checks whether corners in the geometric shape form an effective angle that is below an acute angle threshold T defined by an acute angle check mask rule.

The mask rule checking system 200 may performs the steps 1020, 1030, 1040, and 1050 for multiple points of the geometric shape. The mask rule checking system 200 selects 1020 as point V for performing acute angle check. The selected point V is referred to as a vertex point. The mask rule checking system 200 determines 1030 a pair of points (Q, R) on the boundary of the geometric shape. Each point Q, R from the pair of points is at a threshold distance A from the vertex point V. The mask rule checking system 200 determines an angle X formed by segments or lines, for example, secant lines obtained by connecting each of Q and R and the vertex point V. Accordingly, one secant connects Q and V and another secant connects R and V.

The mask rule checking system 200 determines 1040 whether the determined angle X is below an acute angle threshold T. If the mask rule checking system 200 identifies vertex points associated with an angle formed with the above secant lines as being smaller than the acute angle threshold T, the mask rule checking system 200 reports 1040 the identified vertex points as mask rule violations.

As shown in FIG. 9B, the angle check parameters can be set to so that very small notches can be detected. For example, the threshold distance T is set to a very small value that is a fraction of the smallest distance in the system for representing a polygon, i.e., dbu (database unit). For example, the threshold distance A is set to a value 0.1*dbu. The acute angle threshold T may be set to any desired value, for example, 90 degrees.

The mask rule checking system is able to execute the process of FIG. 10 to determine these small notches. This check will identify these notches but will not flag any other areas of the geometric shapes since those are checked using a different value of threshold distance A. Accordingly, the mask rule checking system 200 is able to perform different types of acute angle checks for the same acute angle threshold T by setting different values for the threshold distance A.

Combining Angle and Dimensionality Checks

The process illustrated in FIG. 3 excludes portions of the geometric shapes from width checks, for example, corners of geometric shapes. As a result, these portions may not get checked for width violations. However, there may be other types of mask rule violations in these portions, such as acute angle violations. The process illustrated in FIG. 10 can be run in addition to the process in FIG. 3 to ensure that both types of violations are caught.

If the mask rule checks allow certain types of geometric shapes, the mask rule checking system 200 determines parameters for both processes (FIGS. 3 and 10) based on the type of geometric shape.

Figure 11:
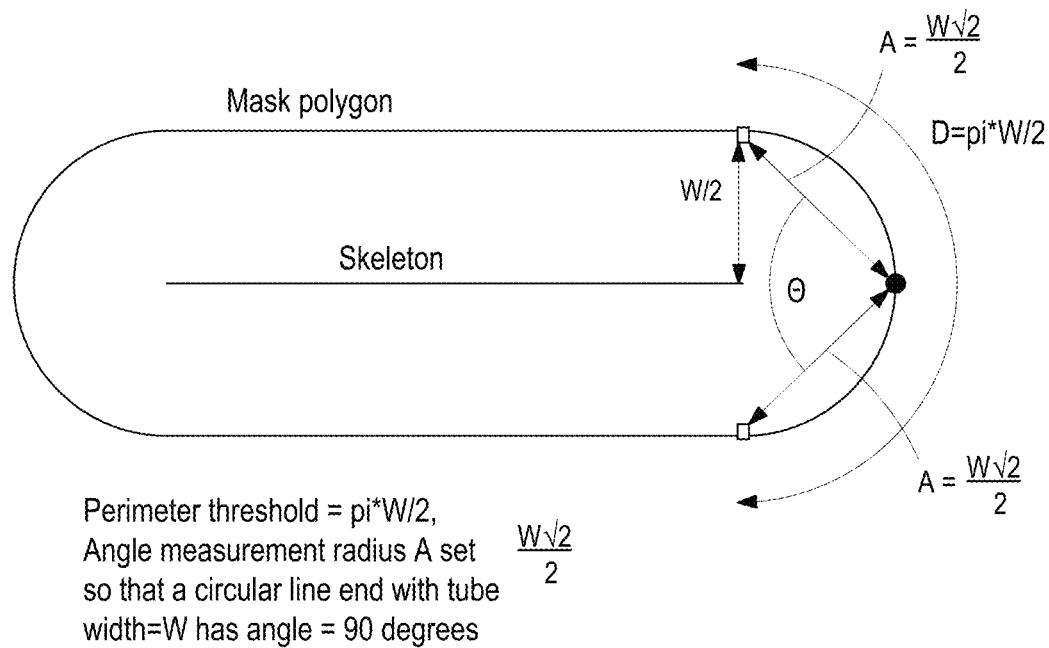
FIG. 11 illustrates the parameters for geometric shapes with circular corners according to an embodiment.

FIG. 11 illustrates the parameters for geometric shapes with circular corners according to an embodiment. The mask rule checking system 200 selects the perimeter threshold to be the value $\pi W/2$. Furthermore, mask rule checking system 200 determines the threshold distance value A to be $W\sqrt{2}/2$ i.e., a side of a right-angled triangle with hypotenuse W. The mask rule checking system 200 determines the acute angle threshold T to be 90 degrees (a right angle) based on a circular shape of the corners. The mask rule checking system 200 may scale these parameters by a factor to introduce some allowance so that shapes that are substantially circular will be permitted but shapes that are too different from circular shapes will be flagged as mask rule violations.

Figure 12:
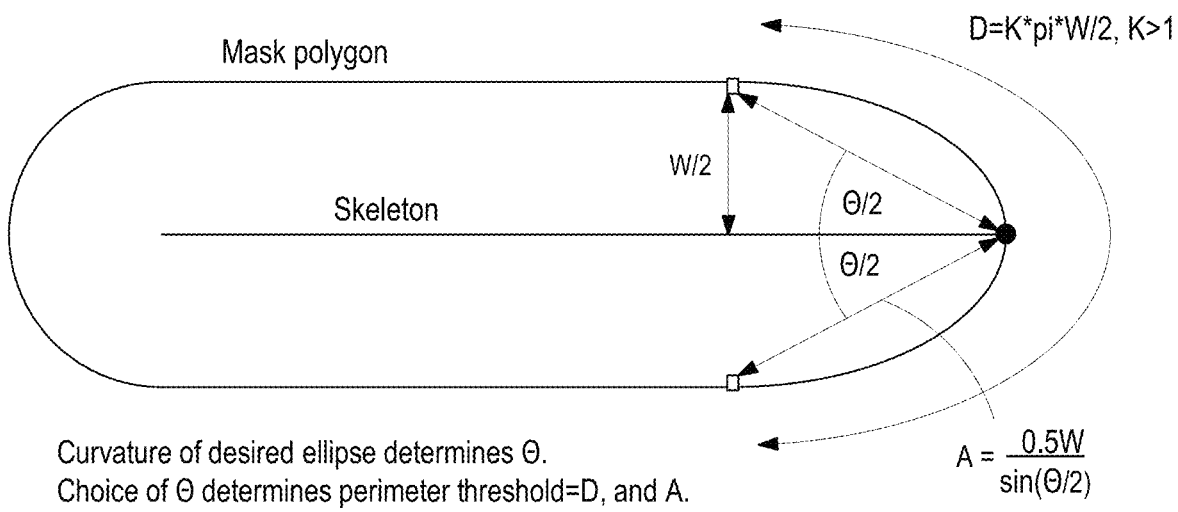
FIG. 12 illustrates the parameters for geometric shapes with elliptical corners according to an embodiment.

FIG. 12 illustrates the parameters for geometric shapes with elliptical corners according to an embodiment. For elliptical shaped corners, the mask rule checking system 200 determines the perimeter threshold to be $K\pi W/2$ where K is a factor that is greater than 1 and depends on the curvature of elliptical shape that is permitted by the mask rules for corners. For example, for ellipses that represent very sharp corners, the value of K is higher and for ellipses that are less sharp (i.e., almost circular corners), the value of K is closer to 1. The value of the threshold distance A is determined to be $0.5 W/\sin(\theta/2)$ where the acute angle threshold is $\theta$. The value of $\theta$ is less than 90 degrees for elliptical shapes that represent sharp corners. The curvature of the permitted ellipse determines the value of acute angle threshold is $\theta$. Accordingly, sharp corners with highly curved ellipses have small value of $\theta$ and less sharp corners with less curved ellipses have higher values of $\theta$.

Fixing Geometric Shapes that Violate Mask Rules

In some embodiments, the mask rule checking system 200 reports the locations of the violations, for example, via a user interface or via a message. The report describing the mask rule violations may be presented to a user for manual review. The report may present an image of the mask highlighting the various violations, for example, various portions of edges of a geometric shape that show width violations as illustrated in FIG. 8 or portions of geometric shapes representing corners that violate angle checks.

In some embodiments, the mask rule checking system 200 modifies the geometric shapes so as to remove the mask violations. The mask rule checking system 200 may send the modified mask to a user for manual review or send the mask for fabrication of the chip for the electronic circuit corresponding to the mask.

Figure 13:
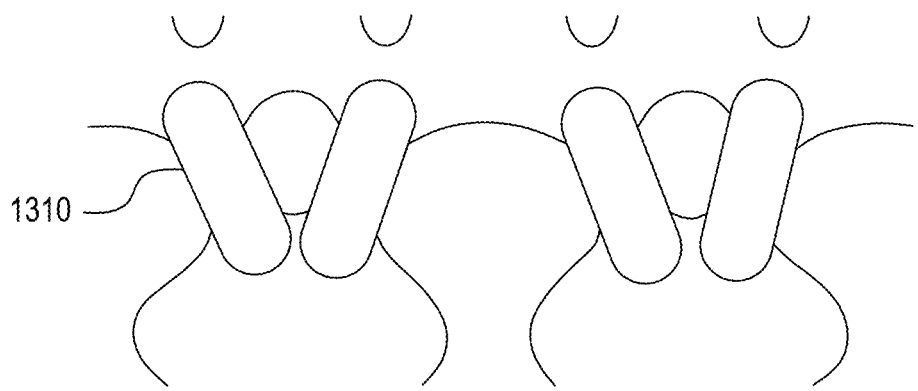
FIG. 13 illustrates modifying the mask to fix width violations according to an embodiment.

FIG. 13 illustrates modifying the mask to fix width violations according to an embodiment. As shown in FIG. 8 the mask rule checking system 200 identifies portions of the medial axis and the corresponding boundaries of the geometric shape that have the width violation. The mask rule checking system 200 increases the size of the medial axis portion 1310 associated with the width violation to the specified width, i.e., W/2. The mask rule checking system 200 adjusts the geometric shape of the mask and the removes the expanded medial axis to obtain the geometric shape 1320 that does not have the width violation.

Figure 14A:
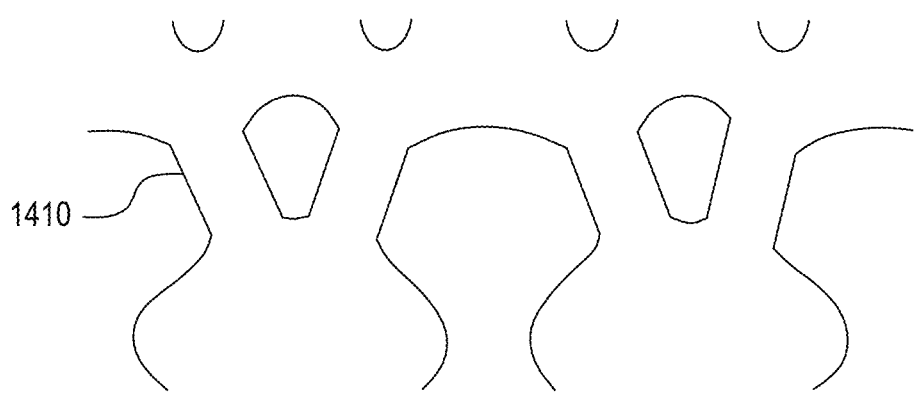
FIG. 14A shows a modified mask in which a width violation is fixed according to an embodiment.
Figure 14B:
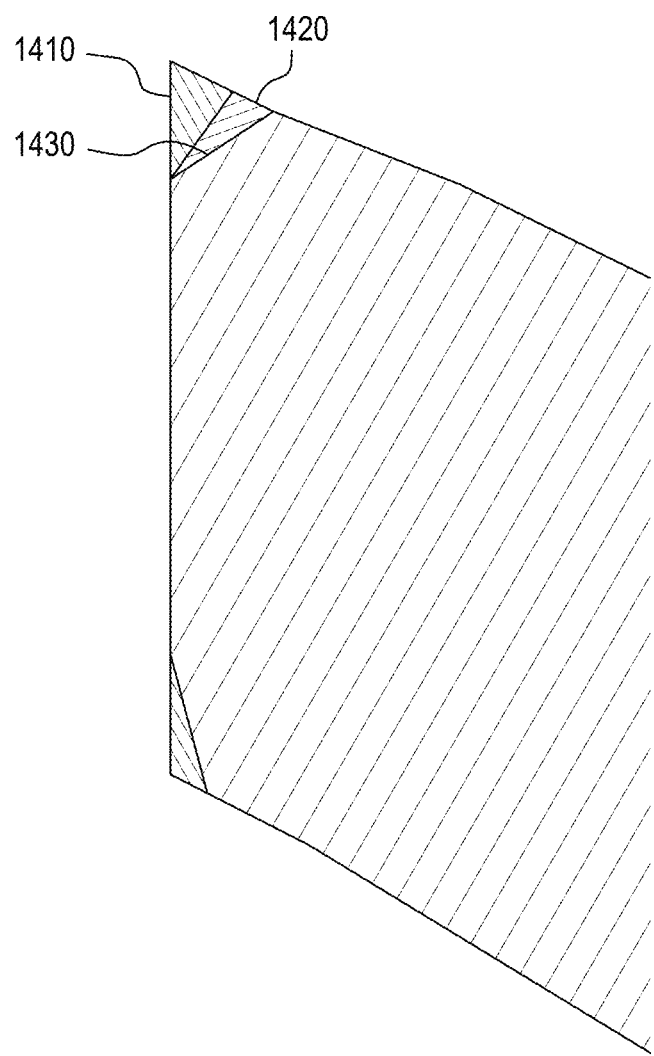
FIG. 14B shows example angle violations and modification of the mask to fix the angle violation according to an embodiment.

FIG. 14A shows the modified mask in which a width violation 1310 as shown in FIG. 13 is fixed 1410 according to an embodiment. The mask rule checking system 200 may fix angle violations using various techniques. The technique used for fixing an angle violation depend on the angle and size of the threshold distance A. FIG. 14B shows example angle violations and modification of the mask to fix the angle violation according to an embodiment. For small violations as shown in FIG. 14B, the mask rule checking system 200 removes the vertex which is at the point of the corner. As shown in FIG. 14B, the original mask shape is 1410, the shape as modified after the first iteration is 1420, and the shape as modified after the second iteration is 1430.

For angle violations which may be detrimental to the lithographic performance because of the removal, for example at a polygon end as shown in FIG. 12, the mask rule checking system 200 reconstructs as mask rule check compliant polygon corner by using multiple vertices to replace a non-compliant vertex. The multiple vertices create a smooth corner that does not have an effective acute angle and therefore does not violate the angle mask rule.

Minimum Distance Check Between Geometric Shapes

Mask rules include a distance mask rule that requires a minimum distance $D_m$ between geometric shapes. Two adjacent Manhattan shapes that are parallel with each other have the same distance between them, independent of where the distance is measured. Accordingly checking for violation of the distance mask rule is simple for Manhattan shapes. However, the distance between two adjacent curvilinear shapes depends on where the distance is measured. For example, two curvilinear shapes may have one distance value if measured at one location and another distance value if measured at another location. Therefore, conventional techniques that detect violation of distance mask rule for Manhattan shapes do not work for curvilinear shapes. Embodiments perform distance checks of curvilinear shapes to determine whether the mask representation maintains the minimum distance $D_m$ between any two geometric shapes.

Figure 15:
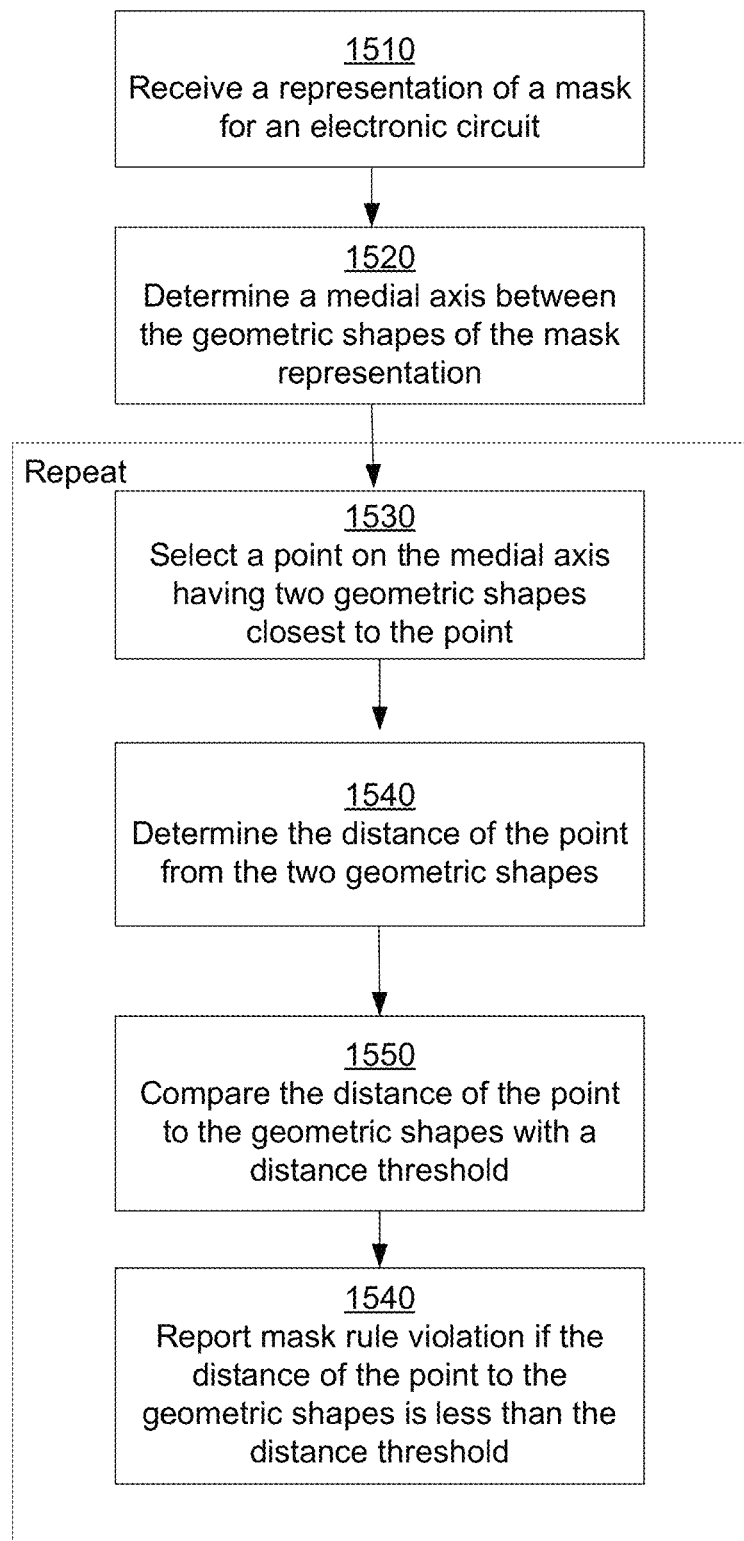
FIG. 15 shows a flowchart illustrating the process for performing distance checks for curvilinear shapes according to an embodiment.

FIG. 15 shows a flowchart illustrating the process for performing distance checks for curvilinear shapes according to an embodiment. The steps may be performed by the distance checking component 250 or by any other component.

The mask rule checking system 200 receives 1510 a mask representation including curvilinear shapes for performing mask rule checks. The mask rule checking system 200 determines 1520 a medial axis between the geometric shapes of the mask representation. The medial axis includes points between geometric shapes. Each point of the medial axis is equidistant from at least two geometric shapes. The medial axis represents a Voronoi diagram of the input geometric shapes representing the mask. The medial axis generation component 210 determines and stores the edges of a pair of geometric shapes that were responsible for creating each portion of the medial axis and may store the distance of point or portions of the medial axis from geometric shapes.

The mask rule checking system 200 repeats the following steps for each portion of the medial axis that is associated with a pair of geometric shapes. The mask rule checking system 200 samples a set of points of the portion of the medial axis and repeats the steps 1530, 1540, 1550, and 1560 for each sampled point.

The mask rule checking system 200 selects 1530 a point $P_x$ on the medial axis that is associated with two points $P_{x1}$ and $P_{x2}$, such that $P_{x1}$ is on a geometric shape S1 and $P_{x2}$ is on geometric shape S2. The point $P_x$ is equidistant from the two points $P_{x1}$ and $P_{x2}$. The mask rule checking system 200 determines 1540 the distance D between the point $P_x$ and the two points $P_{x1}$ and $P_{x2}$ which represents the distance between the point $P_x$ on the medial axis and the geometric shapes S1 and S2.

The mask rule checking system 200 compares the distance D with a distance threshold $T_D$. If the mask rule checking system 200 determines that the distance D is less than the distance threshold $T_D$ the mask rule checking system 200 reports a mask rule violation between the two geometric shapes S1 and S2. If for every sampled point, the mask rule checking system 200 determines that the distance D is at least the distance threshold $T_D$, the mask rule checking system 200 may store information indicating that there is no distance violation between the two geometric shapes.

The distance threshold $T_D$ is determined based on the minimum distance $D_m$ between geometric shapes as specified by the distance mask rule. In an embodiment, the distance threshold $T_D$ is equal to (or substantially equal to) half of the minimum distance $D_m$ as specified by the distance mask rule, i.e., the distance threshold $T_D=D_m/2$.

The mask rule checking system 200 may present the mask rule violations to a user, for example, via a message or a user interface. In an embodiment, the mask rule checking system 200 modifies the mask by moving the geometric shapes to eliminate the distance mask rule violations. Accordingly, the mask rule checking system 200 increases the distance between a pair of geometric shapes so that the distance between each point of the set of points and the geometric shapes from the pair of geometric shapes is at least the threshold distance.

The mask rule checking system 200 may not be able to move the geometric shapes without violating another mask rule, for example distance mask rule between a different pair of geometric shapes. If the mask rule checking system 200 is not able to move the geometric shapes to remove the violations, the mask rule checking system 200 presents information describing the violations to a user, for example, via a user interface so that the user can manually modify the mask so that there is no mask violation.

In some embodiments, the minimum distance check is performed by transforming the mask as described in connection with FIG. 4D by adding a geometric shape that encompasses the geometric shapes of the mask and inverting the geometric shapes to be treated as holes in the added geometric shape. The mask rule checking system 200 performs the minimum distance check between geometric shapes by performing the width check of using an interior medial axis as illustrated by the flowchart of FIG. 3.

Electronic Design Automation Process

Figure 16:
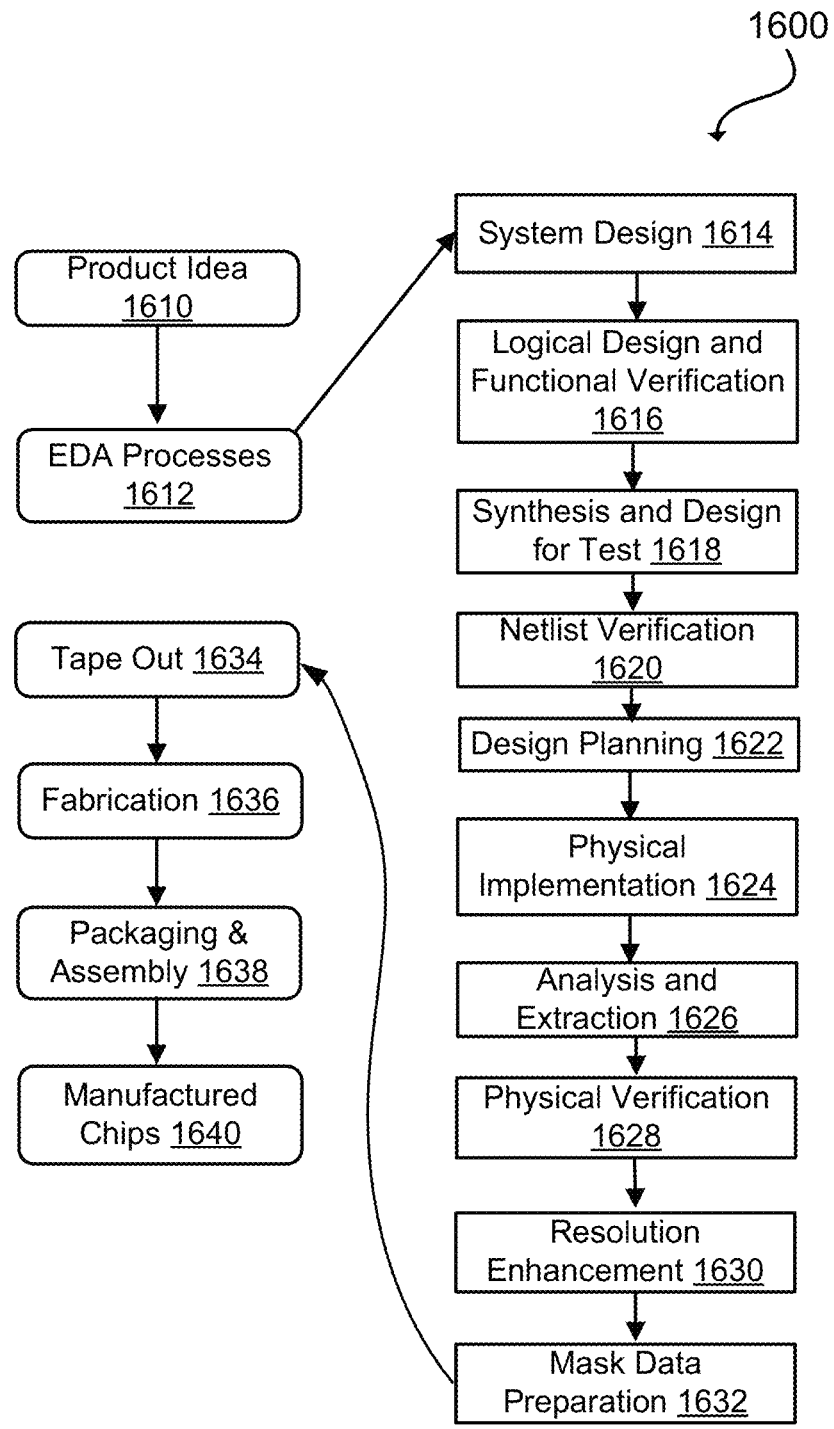
FIG. 16 depicts a flowchart of various processes used during the design and manufacture of an integrated circuit in accordance with some embodiments of the present disclosure.

FIG. 16 illustrates an example set of processes 1600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1610 with information supplied by a designer, information which is transformed to create an article of manufacture that uses a set of EDA processes 1612. When the design is finalized, the design is taped-out 1634, which is when artwork (e.g., geometric patterns) for the integrated circuit is sent to a fabrication facility to manufacture the mask set, which is then used to manufacture the integrated circuit. After tape-out, a semiconductor die is fabricated 1636 and packaging and assembly processes 1638 are performed to produce the finished integrated circuit 1640.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 16. The processes described by be enabled by EDA products (or tools).

During system design 1614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1620, the netlist is checked for compliance with timing constraints and for correspondence with the HDL code. During design planning 1622, an overall floor plan for the integrated circuit is constructed and analyzed for timing and top-level routing.

During layout or physical implementation 1624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1626, the circuit function is verified at the layout level, which permits refinement of the layout design. During physical verification 1628, the layout design is checked to ensure that manufacturing constraints are correct, such as DRC constraints, electrical constraints, lithographic constraints, and that circuitry function matches the HDL design specification. During resolution enhancement 1630, the geometry of the layout is transformed to improve how the circuit design is manufactured.

During tape-out, data is created to be used (after lithographic enhancements are applied if appropriate) for production of lithography masks. During mask data preparation 1632, the 'tape-out' data is used to produce lithography masks that are used to produce finished integrated circuits.

A storage subsystem of a computer system (such as computer system 900 of FIG. 9, or host system 807 of FIG. 8) may be used to store the programs and data structures that are used by some or all of the EDA products described herein, and products used for development of cells for the library and for physical and logical design that use the library.

Embodiments can be used for processing the circuit designs during stages of the electronic design automation process that perform checks of layouts and masks, for example, during tape-out when mask rule checks are performed.

Computer Architecture

Figure 17:
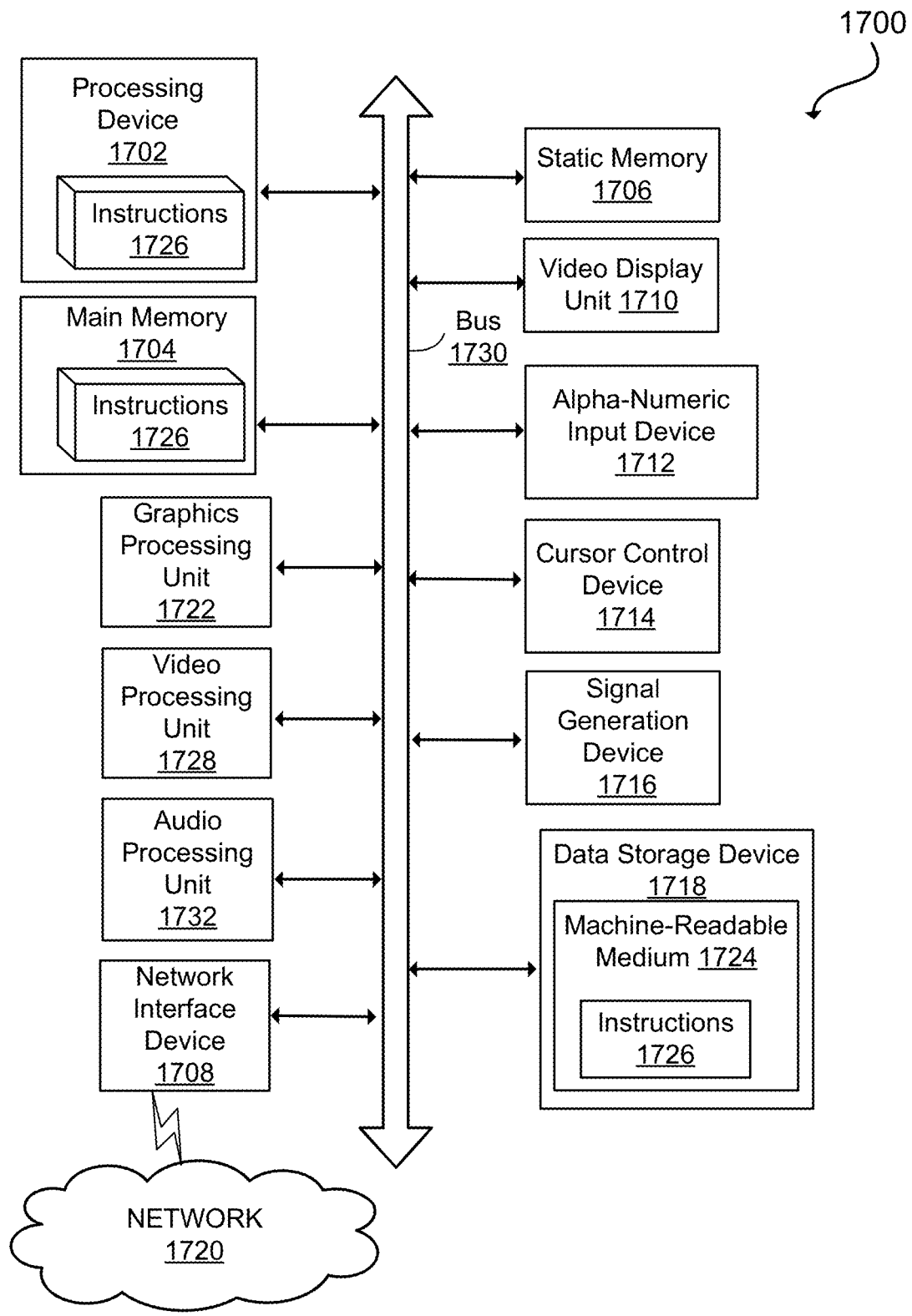
FIG. 17 depicts an abstract diagram of an example computer system in which embodiments of the present disclosure may operate.

FIG. 17 illustrates an example machine of a computer system 1700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1700 includes a processing device 1702, a main memory 1704 (e.g., read-only memory (ROM), flash memory, dynamic random access memory (DRAM) such as synchronous DRAM (SDRAM), a static memory 1706 (e.g., flash memory, static random access memory (SRAM), etc.), and a data storage device 1718, which communicate with each other via a bus 1730.

Processing device 1702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1702 may also be one or more special-purpose processing devices such as an application specific integrated circuit (ASIC), a field programmable gate array (FPGA), a digital signal processor (DSP), network processor, or the like. The processing device 1702 may be configured to execute instructions 1726 for performing the operations and steps described herein.

The computer system 1700 may further include a network interface device 1708 to communicate over the network 1720. The computer system 1700 also may include a video display unit 1710 (e.g., a liquid crystal display (LCD) or a cathode ray tube (CRT)), an alphanumeric input device 1712 (e.g., a keyboard), a cursor control device 1714 (e.g., a mouse), a graphics processing unit 1722, a signal generation device 1716 (e.g., a speaker), graphics processing unit 1722, video processing unit 1728, and audio processing unit 1732.

The data storage device 1718 may include a machine-readable storage medium 1724 (also known as a non-transitory computer-readable medium) on which is stored one or more sets of instructions 1726 or software embodying any one or more of the methodologies or functions described herein. The instructions 1726 may also reside, completely or at least partially, within the main memory 1704 and/or within the processing device 1702 during execution thereof by the computer system 1700, the main memory 1704 and the processing device 1702 also constituting machine-readable storage media.

In some implementations, the instructions 1726 include instructions to implement functionality corresponding to the present disclosure. While the machine-readable storage medium 1724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for performing mask rule checks for a mask representation of an electronic circuit, the method comprising:
    receiving the mask representation of the electronic circuit, the mask representation comprising a plurality of geometric shapes;
    determining a medial axis for the plurality of geometric shapes, wherein a portion of the medial axis includes points that are equidistant from a pair of geometric shapes; and
    for each point from a set of points on the portion of the medial axis:
        determining a distance between the point and each geometric shape from the pair of geometric shapes;
        determining whether the distance between the point and each of the pair of geometric shapes is less than a threshold distance; and
        responsive to determining that the distance between the point and each of the pair of geometric shapes is less than the threshold distance, reporting the pair of geometric shapes as a violation of a mask rule.

2. The method of claim 1, wherein the threshold distance is determined based on a minimum distance threshold between geometric shapes specified by a mask rule.

3. The method of claim 1, wherein the threshold distance is determined to be substantially equal to half a minimum distance threshold between geometric shapes specified by a distance mask rule.

4. The method of claim 1, further comprising:
    increasing the distance between the pair of geometric shapes so that the distance between the pair of geometric shapes is at least the minimum distance threshold specified by the distance mask rule.

5. The method of claim 1, further comprising:
    determining whether increasing the distance between the pair of geometric shapes results in violation of another mask rule; and
    responsive to determining that increasing the distance between the pair of geometric shapes results in violation of another mask rule, requesting manual modification of the mask for removing the violation of the mask rule.

6. The method of claim 1, wherein one or more geometric shapes from the pair of geometric shapes are curvilinear.

7. The method of claim 1, further comprising:
    storing in association with a portion of the medial axis, the pair of geometric shapes and distances of one or more points on the portion of the medial axis with each of the pair of geometric shapes.

8. A non-transitory computer readable storage medium storing instructions that when executed by a computer processor cause the computer processor to perform a method for performing mask rule checks for a mask representation of an electronic circuit, the instructions causing the computer processor to:
    receive the mask representation of the electronic circuit, the mask representation comprising a plurality of geometric shapes;

determine a medial axis for the plurality of geometric shapes, wherein a portion of the medial axis includes points that are equidistant from a pair of geometric shapes; and for each point from a set of points on the portion of the medial axis:
- determine a distance between the point and each geometric shape from the pair of geometric shapes;
- determine whether the distance between the point and each of the pair of geometric shapes is less than a threshold distance; and
- responsive to determining that the distance between the point and each of the pair of geometric shapes is less than the threshold distance, report the pair of geometric shapes as a violation of a mask rule.

9. The non-transitory computer readable storage medium of claim 8, wherein the threshold distance is determined based on a minimum distance threshold between geometric shapes specified by a mask rule.

10. The non-transitory computer readable storage medium of claim 8, wherein the threshold distance is determined to be substantially equal to half a minimum distance threshold between geometric shapes specified by a distance mask rule.

11. The non-transitory computer readable storage medium of claim 8, wherein the instructions further cause the computer processor to:
increase the distance between the pair of geometric shapes so that the distance between the pair of geometric shapes is at least the minimum distance threshold specified by the distance mask rule.

12. The non-transitory computer readable storage medium of claim 8, wherein the instructions further cause the computer processor to:
- determine whether increasing the distance between the pair of geometric shapes results in violation of another mask rule; and
- responsive to determining that increasing the distance between the pair of geometric shapes results in violation of another mask rule, request manual modification of the mask for removing the violation of the mask rule.

13. The non-transitory computer readable storage medium of claim 8, wherein one or more geometric shapes from the pair of geometric shapes are curvilinear.

14. The non-transitory computer readable storage medium of claim 8, wherein the instructions further cause the computer processor to:
storing in association with a portion of the medial axis, the pair of geometric shapes and distances of one or more points on the portion of the medial axis with each of the pair of geometric shapes.

15. A computer system comprising:
a computer processor, and
a non-transitory computer readable storage medium storing instructions that when executed by a computer processor cause the computer processor to perform a method for performing mask rule checks for a mask representation of an electronic circuit, the instructions causing the computer processor to:
receive the mask representation of the electronic circuit, the mask representation comprising a plurality of geometric shapes;
determine a medial axis for the plurality of geometric shapes, wherein a portion of the medial axis includes points that are equidistant from a pair of geometric shapes; and
for each point from a set of points on the portion of the medial axis:
- determine a distance between the point and each geometric shape from the pair of geometric shapes;
- determine whether the distance between the point and each of the pair of geometric shapes is less than a threshold distance; and
- responsive to determining that the distance between the point and each of the pair of geometric shapes is less than the threshold distance, report the pair of geometric shapes as a violation of a mask rule.

16. The computer system of claim 15, wherein the threshold distance is determined based on a minimum distance threshold between geometric shapes specified by a mask rule.

17. The computer system of claim 15, wherein the threshold distance is determined to be substantially equal to half a minimum distance threshold between geometric shapes specified by a distance mask rule.

18. The computer system of claim 15, wherein the instructions further cause the computer processor to:
increasing the distance between the pair of geometric shapes so that the distance between the pair of geometric shapes is at least the minimum distance threshold specified by the distance mask rule.

19. The computer system of claim 15, wherein the instructions further cause the computer processor to:
- determining whether increasing the distance between the pair of geometric shapes results in violation of another mask rule; and
- responsive to determining that increasing the distance between the pair of geometric shapes results in violation of another mask rule, requesting manual modification of the mask for removing the violation of the mask rule.

20. The computer system of claim 15, wherein one or more geometric shapes from the pair of geometric shapes are curvilinear.

* * * * *